(12) United States Patent
Simmons et al.

(10) Patent No.: US 6,904,274 B2
(45) Date of Patent: Jun. 7, 2005

(54) SYSTEM AND METHOD FOR INVERTING AUTOMATIC GAIN CONTROL (AGC) AND SOFT LIMITING

(75) Inventors: Sean B. Simmons, Waterloo (CA); Zoltan Kemenczy, Mississauga (CA)

(73) Assignee: Research In Motion Limited, Waterloo (CA)

( * ) Notice: Subject to any disclaimer, the term of this patent is extended or adjusted under 35 U.S.C. 154(b) by 622 days.

(21) Appl. No.: 09/990,126

(22) Filed: Nov. 21, 2001

(65) Prior Publication Data

US 2002/0061738 A1 May 23, 2002

Related U.S. Application Data

(60) Provisional application No. 60/252,794, filed on Nov. 21, 2000.

(51) Int. Cl.[7] .................................................. H04B 7/00
(52) U.S. Cl. ............................... 455/245.1; 455/243.1; 455/247.1; 455/250.1
(58) Field of Search .............................. 455/232.1–254, 455/226.1, 226.2

(56) References Cited

U.S. PATENT DOCUMENTS 3,909,725 A * 9/1975 Baghdady .................... 455/211
4,742,565 A * 5/1988 Iwahashi ................... 455/234.2
6,002,925 A * 12/1999 Vu et al. ...................... 455/313
6,222,472 B1 * 4/2001 Han ............................ 341/139
6,285,863 B1 * 9/2001 Zhang ....................... 455/234.1
6,625,433 B1 * 9/2003 Poirier et al. ............. 455/232.1
6,731,703 B2 * 5/2004 Kurihara ..................... 375/345
2002/0181623 A1 * 12/2002 Auranen et al. ............ 375/345
2003/0035549 A1 * 2/2003 Bizjak et al. .................. 381/56

* cited by examiner

Primary Examiner—Curtis Kuntz
Assistant Examiner—Tuan Pham
(74) Attorney, Agent, or Firm—Jones Day; Krishna K. Pathiyal; Robert C. Liang

(57) ABSTRACT

A soft limiter for a signal processor includes a variable-gain amplifier, and a threshold detector. The variable-gain amplifier includes a signal input for receiving an input signal, a signal output for providing an output signal representative of the input signal, and a gain control input for controlling a gain of the amplifier. The threshold detector is coupled to the gain control input, and includes a control input for receiving a control variable thereon. The threshold detector is configured to set the gain of the amplifier to a first gain value when the control variable exceeds a threshold value, and to set the gain to a second gain value different from the first gain value when the control variable is less than the threshold value.

75 Claims, 11 Drawing Sheets

SYSTEM AND METHOD FOR INVERTING AUTOMATIC GAIN CONTROL (AGC) AND SOFT LIMITING

CROSS-REFERENCE TO RELATED APPLICATION

This application claims priority from U.S. Provisional Application Ser. No. 60/252,794, filed on Nov. 21, 2000. The complete disclosure of this provisional application, including drawings, is hereby incorporated into this application by reference.

FIELD OF THE INVENTION

The present invention relates to gain control in communication signal receivers. In particular, the present invention relates to a receiver having a variable-gain amplifier and operable in an environment where input signal level has a large dynamic range.

BACKGROUND OF THE INVENTION

Wireless communication systems are often vulnerable to fading and other effects, which may cause the amplitude of received signals to vary. Consequently many wireless receivers employ automatic gain control (AGC) circuits which attempt maintain an output scaled signal at a substantially constant amplitude or power level, despite variations in a received signal.

Conventional AGC circuits typically include a variable-gain amplifier, an envelope or power detector connected to the output of the variable-gain amplifier, and a comparator connected to the output of the detector. The gain of the variable-gain amplifier varies with a gain control input signal supplied to the amplifier. Consequently, the amplifier produces an output signal whose amplitude varies with the gain control input signal. The detector measures the amplitude or power of the signal output from the amplifier. The comparator compares the detector output with a reference signal, and normally supplies a difference signal to the variable-gain amplifier as the gain control input signal.

Recently, AGC circuits are being implemented using digital electronics. A typical digital AGC circuit includes an analog variable-gain amplifier, an analog-to-digital converter (ADC) connected to the output of the amplifier for converting the analog input signal into digital form, a digital amplitude or power detector connected to the output of the ADC for estimating the amplitude or power of the signal output from the ADC, a digital gain controller connected to the output of the detector for calculating the appropriate gain for the variable-gain amplifier, and a digital-to-analog (DAC) connected to the output of the DSP for supplying either a gain value or a gain control value as an analog gain control input signal to the variable-gain amplifier.

Whether implemented using analog components or some combination of digital and analog components, AGC arrangements provide for the use of other receiver components, such as ADCs, having more limited dynamic range than an overall desired operating dynamic range of a receiver. For example, if a receiver with digital signal processing functions operates in an environment where input signal level has a large dynamic range, then either AGC or high resolution ADCs must be used. Unfortunately, the use of high resolution ADCs increase the manufacturing cost and power consumption of the receiver. Although AGC would provide for the use of lower resolution ADCs, the aim of AGC is to maintain a scaled signal within a desired dynamic range, such that the amplitude of the scaled signal output from a variable-gain amplifier or gain stage does not tend to vary significantly, as discussed above. This substantially constant-power signal output from the gain stage is suitable for communication system receivers that use hard decision processing. However, soft decision processing arrangements, which can improve the performance of some receivers, cannot be easily implemented with AGC. Soft decision processing requires absolute signal level information for received signals.

Therefore, there remains a need for a communication device that provides for soft decision receiver processing in a receiver having AGC.

There remains a related need for a system and method for inverting AGC to thereby provide absolute signal level information for soft decision processing of a received communication signal.

There remains a further need for such a system and method that performs soft limiting of absolute amplitude information.

SUMMARY OF THE INVENTION

According to an aspect of the invention, a signal receiver comprises a primary signal processor comprising a signal input configured to receive an input signal having a first signal dynamic range, an intermediate signal output configured to provide a scaled signal representative of the input signal, a primary variable-gain amplifier coupled to the signal input and the intermediate signal output, and a primary gain controller coupled to the primary amplifier and configured to control a gain applied by the primary amplifier to maintain the scaled signal within a second signal dynamic range, and a secondary signal processor comprising a signal input coupled to the intermediate signal output, a final signal output configured to provide an output signal representative of the input signal, a secondary variable-gain amplifier coupled to the intermediate signal output and the final output, and a secondary gain controller coupled to the secondary amplifier and configured to control a gain of the secondary amplifier to set the gain of the secondary amplifier to a first gain value when a parameter associated with the scaled signal exceeds a threshold value, and to set the gain of the secondary amplifier to a second gain value different from the first gain value when the signal parameter is less than the threshold value.

A signal receiver according to a further aspect of the invention comprises a primary signal processor comprising a signal input configured to receive an input signal having a first signal dynamic range, an intermediate signal output configured to provide a scaled signal representative of the input signal, a primary variable-gain amplifier coupled to the signal input and the intermediate signal output, and a primary gain controller coupled to the primary amplifier and configured to control a gain applied by the primary amplifier to maintain the scaled signal within a second signal dynamic range, a secondary signal processor comprising a signal input coupled to the intermediate signal output, a final signal output configured to provide an output signal representative of the input signal, a first secondary variable-gain amplifier having an input coupled to the intermediate output and an output configured to provide a full dynamic range output signal having the first signal dynamic range, a second secondary variable-gain amplifier coupled to the output of the first secondary amplifier and the final output, and a secondary gain controller coupled to the secondary amplifier and comprising a first gain control output configured to control a gain of the first secondary amplifier to set a gain of the first secondary amplifier to an inverse of the gain of the primary amplifier, and a second gain control output configured to control a gain of the second secondary amplifier to set the gain of the second secondary amplifier to a first gain value when a signal parameter of the scaled signal exceeds a threshold value, and to set the gain of the secondary amplifier to a second gain value different from the first gain value when the signal parameter is less than the threshold value.

In a signal receiver, a method for processing a signal according to an embodiment of the invention comprises the steps of receiving an input signal having a first signal dynamic range, applying a first controlled gain to the input signal to provide a scaled signal representative of the input signal, controlling the first controlled gain to maintain the scaled signal within a second signal dynamic range, applying a second controlled gain to the scaled signal to provide an output signal representative of the input signal, and controlling the second controlled gain to set the second controlled gain to a first gain value when a parameter associated with the scaled signal exceeds a threshold value, and to set the second controlled gain to a second gain value different from the first gain value when the signal parameter is less than the threshold value.

In a still further embodiment of the invention, a signal receiver comprises means for processing an input signal having a first signal dynamic range to provide a scaled signal representative of the input signal, the first means for processing comprising means for receiving an input signal, means for amplifying the input signal and means for controlling a gain applied by the means for amplifying to maintain the scaled signal within a second signal dynamic range, and means for processing the scaled signal to provide an output signal representative of the input signal, the means for processing the scaled signal comprising means for amplifying the scaled signal and means for controlling a gain of the means for amplifying the scaled signal to set the gain of the means for amplifying the scaled signal to a first gain value when a parameter associated with the scaled signal exceeds a threshold value, and to set the gain of the means for amplifying the scaled signal to a second gain value different from the first gain value when the signal parameter is less than the threshold value.

A wireless communication device according to another aspect of the invention comprises a transceiver configured to transmit and receive communication signals, a digital signal processor (DSP) operatively coupled to the transceiver, the DSP comprising computer software code for processing a received communication signal having a first dynamic range, by performing the functions of applying a first controlled gain to the received communication signal to provide a scaled signal representative of the received signal, controlling the first controlled gain to maintain the scaled signal within a second signal dynamic range, applying a second controlled gain to the scaled signal to provide an output signal representative of the received signal, and controlling the second controlled gain to set the second controlled gain to a first gain value when a parameter associated with the scaled signal exceeds a threshold value, and to set the second controlled gain to a second gain value different from the first gain value when the signal parameter is less than the threshold value.

In another embodiment, a computer readable medium contains instructions for implementing a method for processing a signal according to an aspect of the invention, the method comprising the steps of receiving an input signal having a first signal dynamic range, applying a first controlled gain to the input signal to provide a scaled signal representative of the input signal, controlling the first controlled gain to maintain the scaled signal within a second signal dynamic range, applying a second controlled gain to the scaled signal to provide an output signal representative of the input signal, and controlling the second controlled gain to set the second controlled gain to a first gain value when a parameter associated with the scaled signal exceeds a threshold value, and to set the second controlled gain to a second gain value different from the first gain value when the signal parameter is less than the threshold value.

BRIEF DESCRIPTION OF THE DRAWINGS

The preferred embodiments of the invention will now be described, by way of example only, with reference to the accompanying drawings, in which:

FIG. 5b is a flow chart describing a variation of the signal processing method shown in FIG. 5a;

DETAILED DESCRIPTION OF THE PREFERRED EMBODIMENTS

Figure 1:
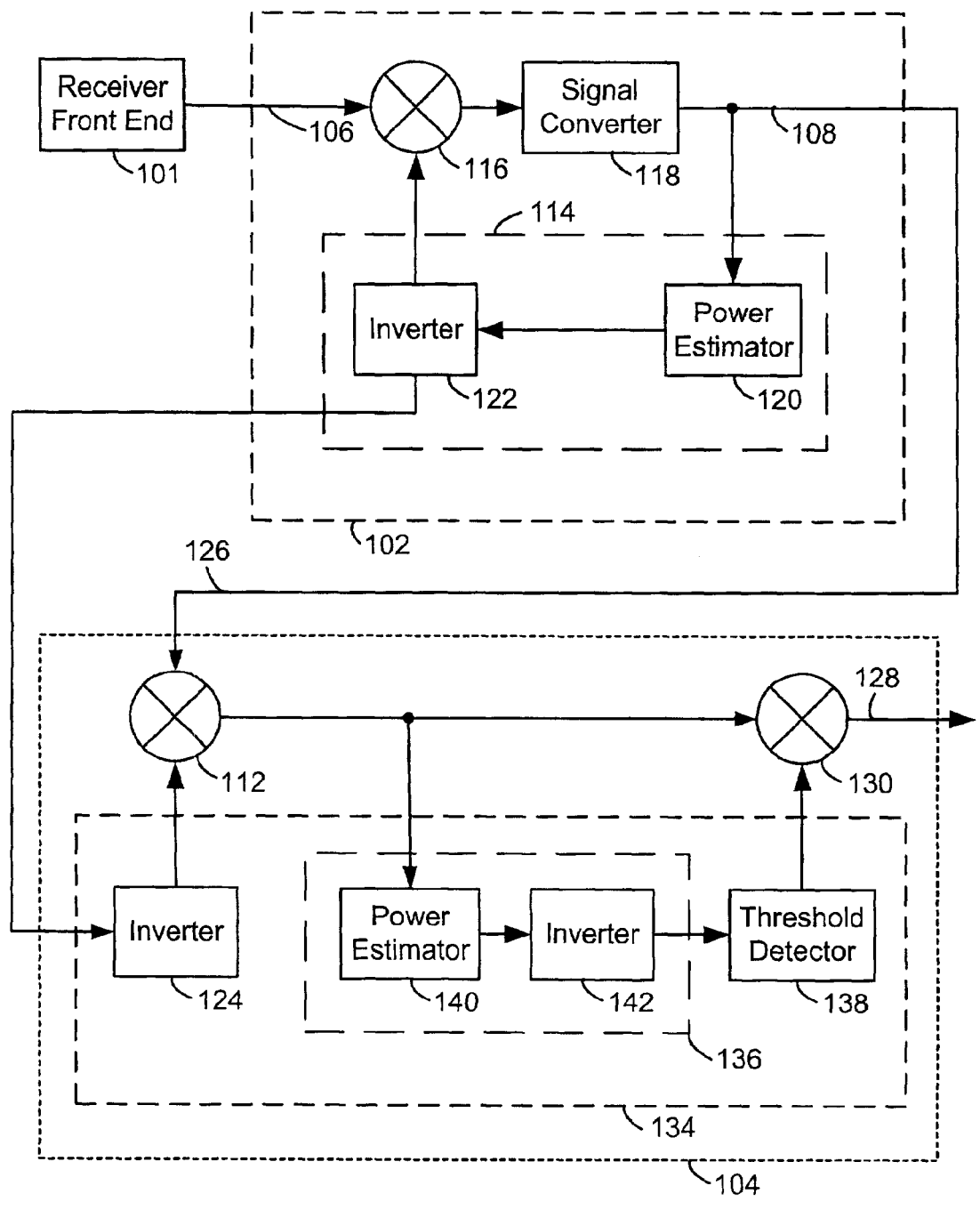
FIG. 1 is a schematic view of a signal receiver according to an aspect of the present invention.

Turning to FIG. 1, a signal receiver, denoted generally as 100, is shown comprising a receiver front end 101, a primary signal processor 102 connected to the receiver front end 101, and a secondary signal processor 104 coupled to the primary signal processor 102. The receiver front end 101 may include an antenna, one or more filters, a frequency converter, and such other components as would typically be found in a communication signal receiver. The primary signal processor 102 includes a signal input 106 for receiving an input signal thereon, a signal output 108 for providing an output signal representative of the input signal, an amplifier 116 coupled to the signal input 106, a signal converter 118 connected to the output of the amplifier 116 and the signal output 108, and a primary gain controller 114 coupled to the output 108 and the amplifier 116.

The amplifier 116 is preferably a variable-gain analog signal amplifier, and has an analog signal input connected to the signal input 106 for receiving the input signal thereon, an intermediate analog signal output for providing a scaled output signal representative of the input signal, and a gain control input for receiving a gain control signal. As will be appreciated, the gain control signal establishes the gain of the analog amplifier 116. The gain control signal may be either a gain value to be applied to a signal on the input 106 or a gain control value which is converted into such a gain value. Consequently, the amplitude and power of the intermediate signal varies with the amplitude and power of the input signal, and the gain as established by the gain control signal.

The signal converter 118 receives the intermediate analog signal from the amplifier 116, and produces a digital representation of the intermediate analog signal at its output. The signal converter 118 may include such components as a quadrature mixer for splitting the intermediate analog signal received from the amplifier 116 into its in-phase (I) and quadrature (Q) components, separate low-pass analog filters each connected to a respective output of the quadrature mixer, and separate ADCs connected to a respective low-pass filter output. The low-pass analog filters serve to limit the bandwidth of the signal digitized by the ADCs. The ADCs are used since most receivers perform signal processing functions in the digital domain. However, it should be understood that the ADCs are not essential features of the invention, and may be eliminated if the receiver is configured to perform signal processing in the analog domain.

The primary gain controller 114 controls the gain of the amplifier 116, and comprises a primary power estimator 120 and a primary inverter 122. The primary power estimator 120 is connected to the in-phase and quadrature digital outputs of the signal converter 118, and calculates the average power of the digital signal provided by the amplifier 116. Alternately, the primary power estimator 120 may calculate the amplitude of the same digital signal.

The primary inverter 122 includes a power/amplitude input for receiving a power/amplitude estimate thereon, and a pair of gain control signal outputs for providing output gain or gain control values. The primary inverter 122 is connected at its power/amplitude input to the digital output of the primary power estimator 120, and is connected at one of its gain value outputs to the gain control input of the amplifier 116. The primary inverter 122 is configured to calculate a gain for the analog amplifier 116 which is inversely proportional to the power/amplitude value received from the power estimator 120 at the power/amplitude input. In this manner, the primary gain controller 114 maintains the scaled analog output signal of the amplifier 116 substantially constant and within the dynamic range of the ADCs in the signal converter 118 and/or possibly other receiver components with limited dynamic range. Since the amplifier 116 is an analog device, the inverter 122 may include a digital-to-analog converter (DAC) (not shown) which provides the analog amplifier 116 with an analog gain value or gain control value at its gain control input. The primary gain controller 114 represents one simple example of a gain controller, in which a power estimate is inverted by the inverter 122. It should be apparent that other types of gain control and gain control algorithms could instead be implemented, without departing from the scope of the present invention.

The digital values output by the signal converter 118 on the signal output 108 are transmitted to the second signal processor 104, for example over a common bus. The secondary signal processor 104 includes a digital signal input 126 for receiving the digital output signal from the primary signal processor 102 thereon, a final signal output 128 for providing an output signal representative of the received digital output signal, a first secondary amplifier 112, a second secondary amplifier 130 coupled to the output of the first secondary amplifier 112 and the final signal output 128, and a secondary gain controller 134 coupled to the secondary amplifier 130.

The first secondary amplifier 112 comprises a variable-gain digital signal amplifier having a digital signal input connected to the digital signal input 126 for receiving the digital output signals from the first signal processor 102 thereon, a digital signal output for providing a digital output signal representative of the digital signal received at the digital signal input, and a gain control input for receiving a gain control signal. The gain control signal establishes the gain of the digital amplifier 112. As shown, a first secondary inverter 124 in the secondary gain controller 134 is connected to an output of the primary inverter 122 and provides a first gain control output as the gain control input to the first secondary amplifier 112. Consequently, the amplitude and power of the digital output signal of the digital amplifier 112 varies with the amplitude and power of the digital signal received at the digital signal input, and the gain as established by the gain control signal, as described in further detail below.

The second secondary amplifier 130 comprises a variable-gain digital signal amplifier, and includes a digital signal input connected to the output of the first secondary amplifier 112, a digital signal output for providing a digital output signal representative of the received digital output signal, and a gain control input for receiving a gain control signal. As will be appreciated, the gain control signal establishes the gain of the secondary amplifier 130. Consequently, the amplitude and power of the digital final output signal varies with the amplitude and power of the digital output signal received from the first secondary amplifier 112, and the gain as established by the gain control signal.

As described above, the primary inverter 122 is configured to calculate a gain for the analog amplifier 116. The first secondary inverter 124 in the secondary gain controller 134 includes a gain value input for receiving a gain value thereon, and a gain value output for providing an output gain value. The first secondary inverter 124 is connected at its gain value input to a gain value output of the primary inverter 122 and at its gain value output to the gain control input of the amplifier 112, and is configured to calculate a gain for the amplifier 112 which is inversely proportional to the gain value applied at the amplifier 112. Since the amplifier 112 is a digital device, the inverter 124 provides the amplifier 112 with a digital gain value or gain control signal at its gain control input.

The secondary gain controller 134 also controls the gain of the second secondary amplifier 130, and comprises a gain estimator 136 and a threshold detector 138. The gain estimator 136 is configured to provide an estimate of the gain value which was applied at the analog amplifier 116, and comprises a secondary power estimator 140, and a second secondary inverter 142. The power estimator 140 is connected to the output of the amplifier 112 and calculates the average power of the digital signal provided thereby. Alternately, the power estimator 140 may calculate the amplitude of the same digital signal. The second secondary inverter 142 includes a power/amplitude input for receiving a power/amplitude estimate thereon, and a gain value output for providing output gain values. The second secondary inverter 142 is connected at its power/amplitude input to the digital output of the power estimator 140, and is connected at its gain value output to the threshold detector 138, and is configured to calculate a gain value which is inversely proportional to the power/amplitude value received from the power estimator 140.

The threshold detector 138 includes a gain value input which is connected to the gain value output of the gain estimator 136, and a gain control output which provides a second gain control output of the secondary gain controller 134 and is connected to the gain control input of the second secondary amplifier 130. The threshold detector 138 is configured to output a first gain value when the received gain value exceeds a threshold value, indicating that the received digital input signal on the digital input 126 and thus the original received analog signal on input 106 is relatively weak, and to output a second gain value different from the first gain value when the received gain value is less than the threshold value, indicating a relatively strong signal. However, it should be understood that the threshold detector 138 is not limited to producing gain values in accordance with gain estimates received from the gain estimator 136. Rather, in one variation (not shown), the third gain inverter 142 is integrated with the threshold detector 138, and the threshold detector 138 is configured to output a gain value in accordance with a power or amplitude value received from the power estimator 140. Consequently, in each instance, together the secondary amplifier 130 and the threshold detector 138 amplify the digital signal output by the amplifier 112 with a first gain value when a signal parameter such as power, amplitude, or gain for example, derived from the digital signal, exceeds a threshold value, and to amplify the same digital signal output signal with a second gain value different from the first gain value when the signal parameter is less than the threshold value. Relatively weak signals and relatively strong signals are thereby processed differently, as described in further detail below.

The second secondary amplifier 130 and the threshold detector 138 are preferably configured to operate as a soft limiter. An advantage of a soft limiter is that the number of data bits which are used to represent each digital sample of the digital signal output by the primary signal processor 102 can be reduced, thereby reducing the digital signal processing power required by digital signal processors connected to the final signal output 128, while preserving absolute signal amplitude information, particularly for relatively weak signals. Such soft limiting provides for soft decision signal processing of the final signal output.

The first signal processor 102 implements a form of AGC. The scaled signal output by the amplifier 116 is maintained within a desired dynamic range by the operation of the feedback loop of the power estimator 120 and inverter 122. Since the inverter 124 calculates a gain that is the inverse of the gain applied at the amplifier 116, the combination of inverter 124 and amplifier 112 operate effectively as an inverse AGC stage, such that the output of the amplifier 126 is a digital representation of the full dynamic range signal at the input 106 of the first signal processor 102. The gain estimator 136, threshold detector 138 and second secondary amplifier 130 operate as a soft limiter which preferably passes relatively weak signals and limits only relatively strong signals. Absolute signal level information for weak signals, which are most important for soft decision signal processing, is thereby provided at the output 128.

Figure 2A:
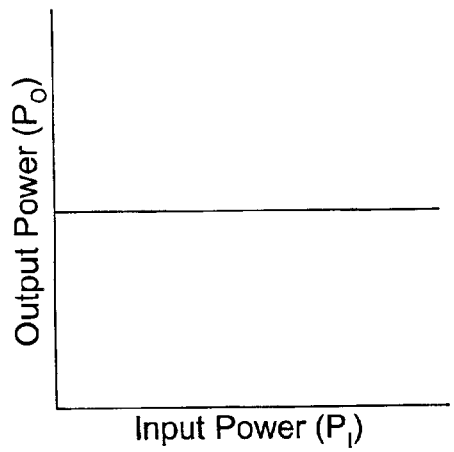
FIGS. 2a to 2c are graphs of output power and input power for conventional signal receivers, and the signal receiver shown in FIG. 1.
Figure 2B:
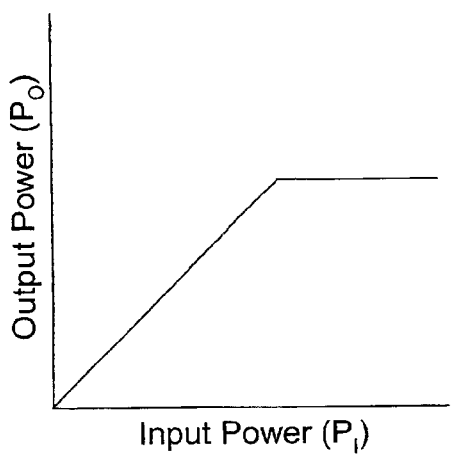
Figure 2C:
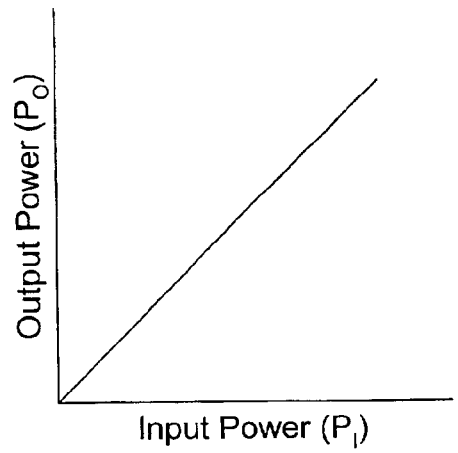
Figure 3:
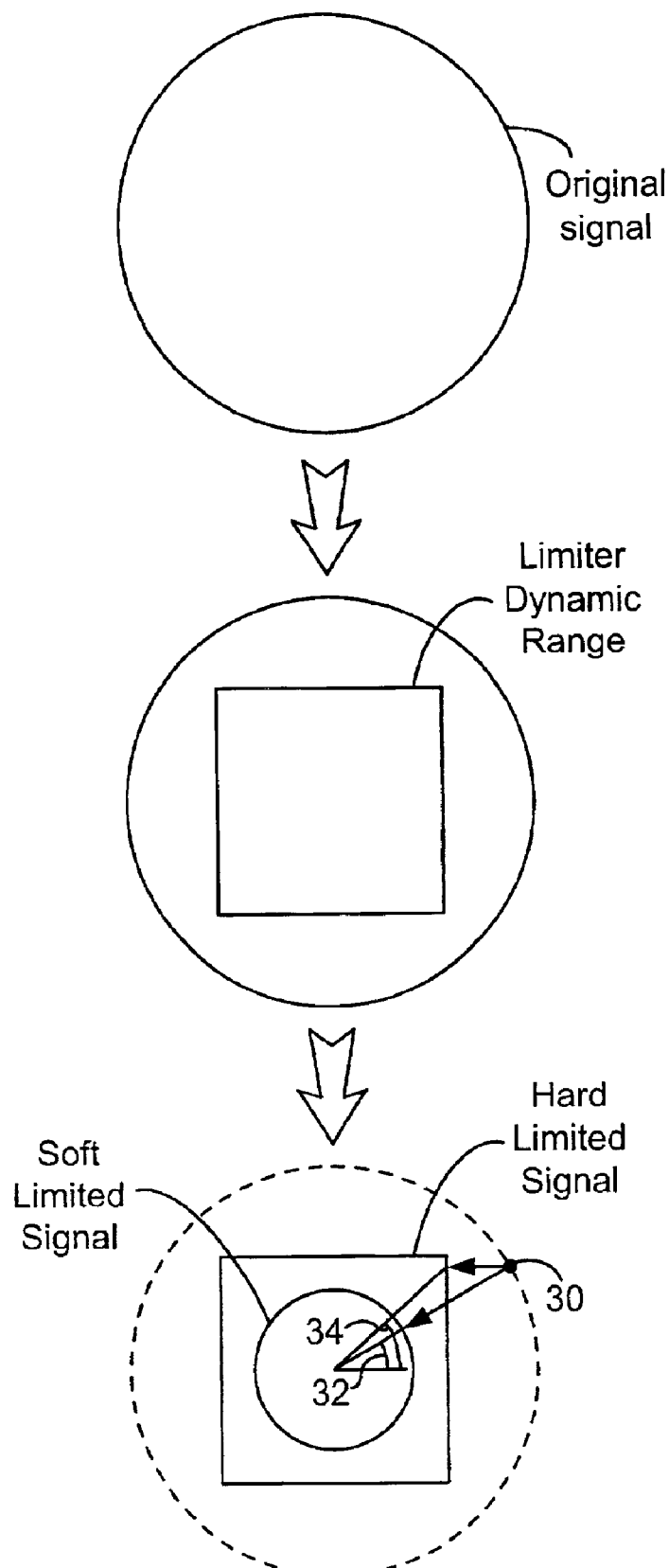
FIG. 3 is a representation in the I-Q plane of hard limiting and soft limiting of a signal.

The soft limiting aspect of the invention can be better understood with reference to FIGS. 2 and 3.

FIG. 2a depicts the AGC process implemented by the amplifier 112 in the primary signal processor 102. As shown, all input signals are either amplified (gain>1), passed (gain= 1) or attenuated (gain<1) to maintain a relatively constant output signal. For any input signal power ($P_I$), output signal power ($P_O$) is maintained substantially constant. FIG. 2c depicts the operation of a signal processor which does not perform any gain control. As shown, all input signals are output with a constant gain. This is the overall effect of the operation of the primary signal processor 102 and the inverse gain stage including the inverter 124 and the amplifier 112. Gain applied at the amplifier 116 is substantially inverted at the second primary amplifier 112, such that the signal on the digital output of amplifier 112 is preferably a digital version of a full dynamic range input signal received on the input 106. FIG. 2b depicts the gain control process preferably implemented by the soft limiter, comprising the secondary gain controller 134 and amplifier 130. As shown, small input signals within a desired or acceptable dynamic range are passed with substantially constant gain, preferably unity gain, by the soft limiter, while the amplitude or power of relatively stronger input signals is limited. As described above, the soft limiting is preferably controlled based on a signal parameter derived from the signal output by the amplifier 112. Comparing FIG. 2b with FIGS. 2a and 2c, it will be apparent that soft limiting according to an aspect of the invention is a compromise between automatic gain control and no gain control.

FIG. 3 is a representation in the I-Q plane of an original signal and how such a signal would be processed by a soft limiter, and a representation in the I-Q plane of the same signal if it was processed by a conventional hard limiter. As will be apparent, a signal will appear in I-Q space as a point following a circular path with radius A, proportional to signal amplitude, at a rotation rate proportional to signal frequency f. When a signal receiver includes a hard limiter to limit the dynamic range of a signal and/or the number of data bits used to represent the digital in-phase component and the digital quadrature component of a signal for example, the signal is "clipped" if the signal power or amplitude of the signal exceeds a threshold value. Processing the digital signal with a hard limiter having a dynamic range shown in the middle diagram in FIG. 3 would alter both the amplitude and phase of the signal, resulting in a transformation of the signal from the original circular representation to the square representation, as shown in the lower drawing of FIG. 3. By doing so, a hard limiter increases the distortion in an output signal. Where information is encoded in the phase of a received signal, as in MSK, GMSK and other phase-modulation schemes for example, such phase distortion may introduce errors when received signals are processed. For example, consider the point 30 on the original, for which the I component but not the Q component is outside the limiter dynamic range. If the signal is hard limited, then its I component is clipped to the limiter dynamic range upper limit. The Q component is within the limiter dynamic range and therefore is not limited. Thus, the point 30, having a phase indicated at 32, is translated to a point on the hard limited signal having a different phase, indicated at 34. Those skilled in the art will appreciate that when information is encoded in the phase of a received signal, the primary amplifier 116 also preferably performs soft limiting, so that an output of the first secondary amplifier 112 accurately reproduces a representation of the signal on input 106.

The soft limiting transformation employed by the secondary signal processor 104 is shown by the inner circle of the lower drawing of FIG. 3. As will be apparent, both the I and Q components of a signal are attenuated when either of the components exceeds the limiter dynamic range to thereby maintain the phase of the original signal. Therefore, the point 30 on the original signal is translated into a point on the soft limited signal having the same phase 32. When an input signal received by the primary signal processor 102 is encoded using phase changes rather than amplitude changes, the soft limiter is able to reduce the number of data bits which are used to represent each digital sample of the signal, thereby reducing the digital signal processing power required by digital signal processors connected to the final signal output 128, without significantly reducing signal quality. Therefore, for the gain control process represented in FIG. 2b and described above, a signal within an acceptable or desired dynamic range will be passed with a substantially constant gain, preferably unity gain, whereas a stronger signal will be soft limited.

Figure 4:
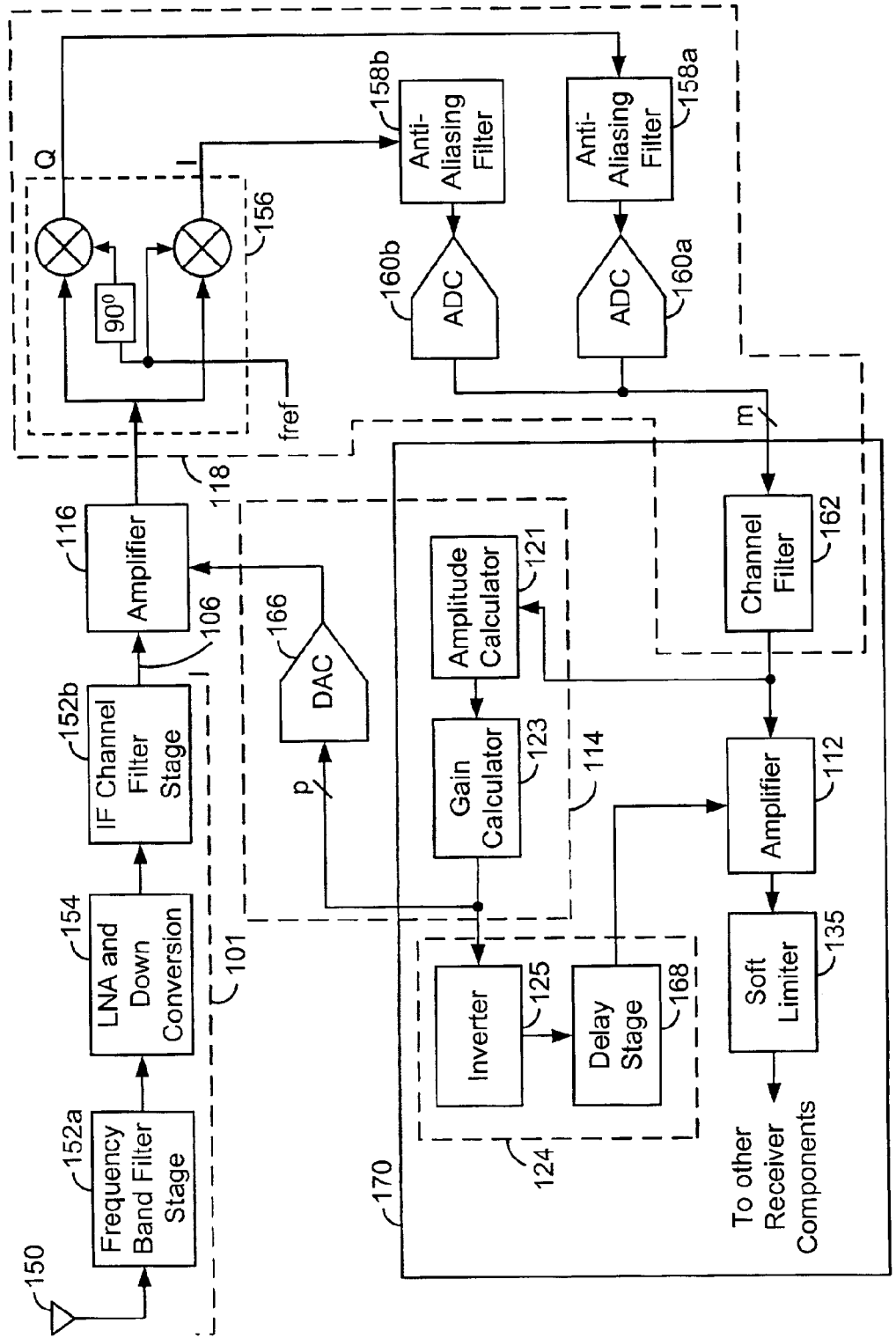
FIG. 4 is a block diagram of an example implementation of the signal receiver shown in FIG. 1.

A block diagram of an implementation of the signal receiver 100 is depicted in FIG. 4. As shown, the receiver front end 101 may include such typical receiver components as an antenna 150 for receiving a wireless input signal, two filter stages 152a, 152b for successively filtering the wireless input signal, and a low noise amplifier (LNA) and frequency down conversion stage 154 disposed between the filter stages 152. It will be apparent that a receiver may include additional or alternative front-end components not shown in FIG. 4, which is merely an illustrative example receiver. In the receiver shown in FIG. 4, the aforementioned variable-gain analog signal amplifier 116 is connected to the output of the LNA stage 154. The channel filter stages 152 each operate as band pass filters, although the bandwidth of the channel filter stage 152b is narrower than that of the frequency band filter stage 152a. The filter stages 152 typically have different centre frequencies. The LNA stage 154 amplifies the filtered signal from the frequency band filter stage 152a and converts the filtered signal from radio frequency (RF) to an intermediate frequency (IF). The signal converter 118 shown in FIG. 1 comprises a quadrature mixer 156 for splitting the analog signal received from the analog signal amplifier 116 into its in-phase (I) and quadrature (Q) components, low-pass anti-aliasing filters 158a, 158b for filtering out image signal components from the analog signal amplifier 116, ADCs 160a, 160b connected to the outputs of the low-pass filters 158, and a digital channel filter 162.

In the receiver of FIG. 4, the power estimator 120 and primary inverter 122 of the primary gain controller 114 in the primary signal processor 102 are embodied as the amplitude calculator 121 and gain calculator 123. The amplitude calculator 121 determines the amplitude of the digital signal samples at the output of the filter 162. The gain calculator 123 is connected at its input to the output of the amplitude calculator 120 and at its output to the DAC 166. The output of the DAC 166 controls the gain of the variable-gain analog signal amplifier 116 and thus represents the analog gain control signal produced by the inverter 122 in FIG. 1.

The amplitude calculator 121 and the gain calculator 123 function to generate a first gain control signal which controls the amount of gain applied to a received signal by the variable-gain analog signal amplifier 116, as described above. The output of the gain calculator 123 may be either a gain value or a gain control value that controls a gain value that is applied to a received signal on input 106 by the variable-gain amplifier 116.

The first secondary inverter 124 is embodied in the receiver shown in FIG. 4 as an inverter 125 and a delay stage 168. The inverter 125 converts the gain value or gain control signal from the gain calculator 123 into a second gain value which represents the amount of gain that is applied to the received signal by the variable-gain analog signal amplifier 116. The second gain value is input to the delay stage 168, which is preferably a delay filter, and then to the amplifier 112. When the output of the gain calculator is a gain control signal instead of an actual gain value, then the inverter 125 may also be configured to perform a control value to gain value conversion.

The inverter 125 and delay stage 168 control the gain of the variable-gain digital signal amplifier 112. The effect of a new gain value at the amplifier 116 is not immediately reflected at the output of channel filter 162. The DAC 166, amplifier 116, the quadrature mixer 156, the anti-aliasing filters 158, the ADCs 160, and the channel filter 162 have inherent signal delays. Therefore, the gain value calculated by the inverter 125 cannot be directly applied to second primary amplifier 112. To ensure that the gain value calculated by the second inverter 125 is properly matched in time with the portion of the signal to which the gain was applied by the amplifier 116, the delay stage 168 is designed such that the calculated gain value and the corresponding portion of the signal to which the gain value was applied by the amplifier 116 arrive at the amplifier 112 simultaneously. Although shown as separate blocks, the delay stage 168 may also be implemented as part of the inverter 124 or the amplifier 112.

The amplifier 112 acts as an inverse gain stage which uses the delayed gain value to generate a signal proportional to the received signal input to the amplifier 116 to thereby provide absolute signal amplitude information. The digital output of the amplifier 112 corresponds to the signal that would be generated at the output of the channel filter 162 if the ADCs 160a, 160b were of sufficient resolution to operate over the full dynamic range of expected received signals and no AGC arrangement were provided. This digital signal is then input to the soft limiter 135, comprising the gain estimator 136, threshold detector 138 and amplifier 130 (FIG. 1), and limited as described briefly above and in further detail below. The soft limited signal output from the soft limiter 135 is then provided to further receiver components, preferably including soft decision signal processing components (not shown). These further components may include a signal detector, demodulator, decoder and the like.

FIG. 4 clearly shows that at least some of the processing components which perform AGC, inverse AGC, and soft limiting operations may be implemented in a digital signal processor (DSP) 170. The receiver components which may perform further processing operations on the soft limited signal output by the soft limiter 135 may or may not necessarily also be implemented in the DSP 170.

The operation of the signal receiver in FIG. 4 will now be described in further detail with reference to FIG. 5a. The method of processing an electronic signal using the signal receiver begins at step 502. An electronic signal is received over the antenna 150 at step 504, and front-end processing thereon (such as filtering, amplification and down conversion) is performed at step 506. At step 508, a gain is applied to the received signal, by the variable-gain analog signal amplifier 116. The amplitude or possibly another measure of signal power of the intermediate signal (at the output of the signal converter 118 in FIG. 1 or channel filter 162 in FIG. 4) is then estimated, by the power estimator 120 or amplitude calculator 121, at step 510. At step 512, a determination is made as to whether or not the power or amplitude of the intermediate signal is within predetermined upper and lower limits of a desired or required dynamic range. This is an AGC function that could be performed in the power estimator 120 or inverter 122 in FIG. 1 or by the amplitude calculator 121 or gain calculator 123 in FIG. 4. If the signal is within this dynamic range, at step 514 the previous gain value applied by the amplifier 116 is maintained. If the power or amplitude of the intermediate signal is not within the predetermined limits, then at step 516 the gain value is increased or decreased sufficiently to bring the power or amplitude of the intermediate signal within the predetermined limits. This increase or decrease in the gain value may be effected for example by a gain control signal to gain value conversion, which may be performed by the inverter 122, gain calculator 123 or the amplifier 116 according to an AGC algorithm.

At step 518, a determination is made as to whether the reception of the electronic signal is complete. If a complete transmission has been received, the method of signal processing ends, at step 520. However, if the transmission is not yet complete, steps 508 through 518 are repeated until such time as the reception of the electronic signal is complete. Although the end of transmission determination is shown following the determination of a new gain, this determination could also be made earlier in the method, before the execution of the amplitude or power measurement step 510, for example, as will be apparent to those skilled in the art.

Inverse gain and soft limiting method steps 524 through 536 are performed in parallel with the AGC method steps 508 through 520. When a gain value is applied to the received signal at step 508, the scaled signal output by the amplifier 116 is eventually received by the amplifier 112. In addition, the gain value or a corresponding control signal is applied to the inverter 125, and delayed by the delay stage 168 to take into account the propagation delay between the amplifier 116 and the amplifier 112. Upon receipt of the gain value and the scaled signal, the second primary amplifier 112 generates the full dynamic range digital signal, at step 524.

Subsequently, at step 526, the power estimator 140 in the soft limiter 135 determines the amplitude or power of the full dynamic range signal, and the third inverter 142 calculates a limiter gain, which is inversely proportional to the amplitude or power of the full dynamic range signal. At step 528, the threshold detector 138 determines whether or not the calculated limiter gain is above a predetermined threshold, corresponding to a relatively low amplitude signal. If the calculated limiter gain is above the predetermined threshold, then the threshold detector 138 calculates a soft limit gain equal to unity gain, at step 532. Otherwise, if the calculated limiter gain is not above the predetermined threshold, the threshold detector 138 calculates a soft limit gain equal to the calculated limiter gain value, at step 530.

The threshold detector 138 applies the soft limit gain value (equal to either unity or the limiter gain value), or alternatively a gain control signal which is converted by the amplifier 130 into such a soft limit gain value, to the gain control input of the amplifier 130. The soft limit gain is then applied to the full dynamic range signal by the secondary amplifier 130, as shown at step 534. For a soft limit gain of unity, the second signal processor 104 passes the full dynamic range signal from the amplifier 112. If the soft limit gain is not unity gain, then the full dynamic range signal is soft limited as described above, to preserve the phase of the full dynamic range signal. The secondary amplifier 130 then outputs a soft limited output signal, at step 536. Steps 522 through 536 are repeated until the end of a transmission is detected at step 518.

Figure 5A:
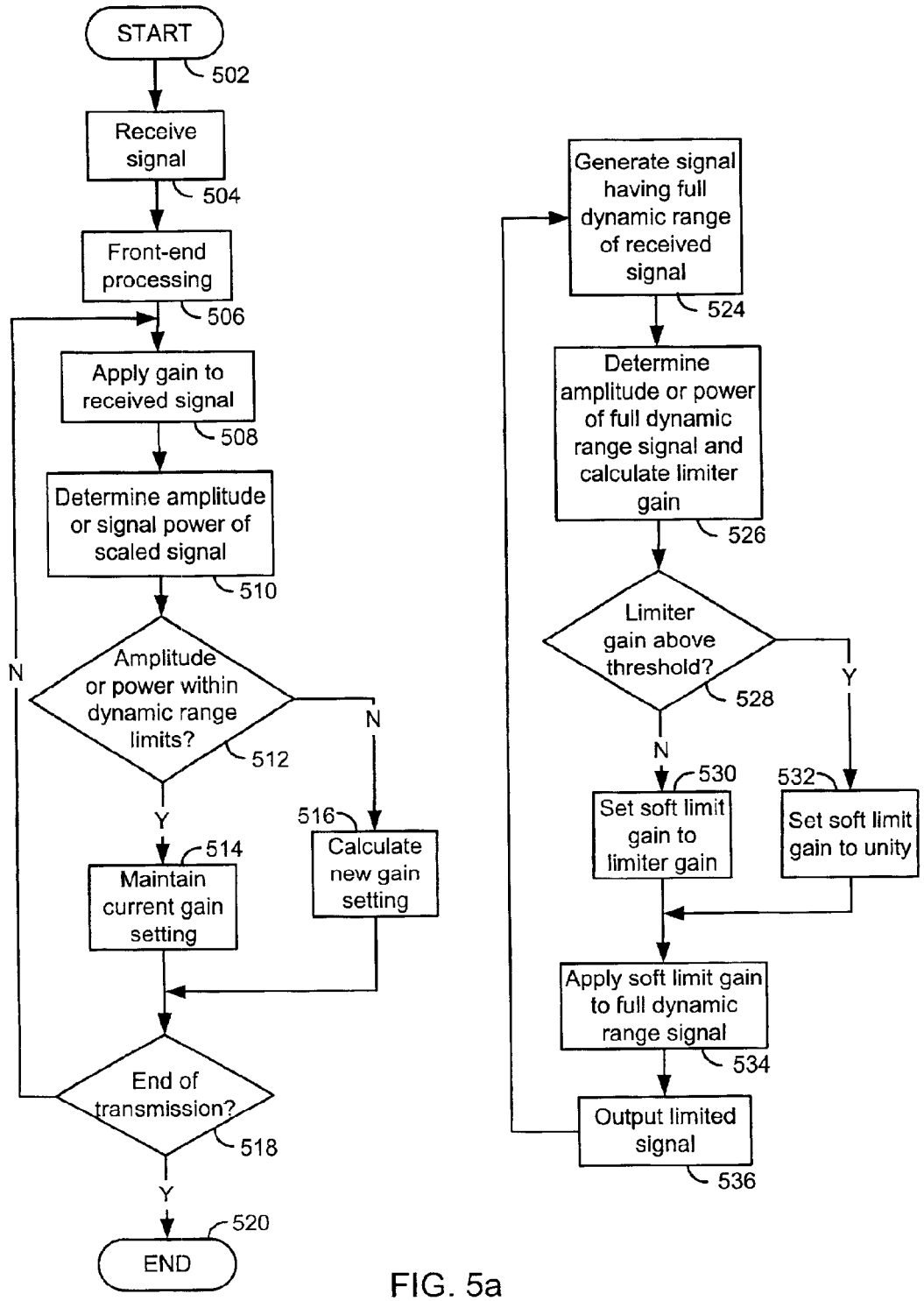
FIG. 5a is a flow chart describing a signal processing method according to an aspect of the invention.

The signal receiver 100 shown in FIGS. 1 and 4, and the method represented by the flow chart of FIG. 5a are only examples of the present invention. The instant invention is in no way restricted thereto. Other gain values and configurations of the signal receiver 100 will be apparent to those skilled in the art to which the invention pertains and are within the scope of the invention. For example, rather than selecting a gain value to be applied at the amplifier 130 based on a received gain value, in one variation the threshold detector 138 makes a selection for the gain value based on the amplitude or power of the full dynamic range signal output signal of the amplifier 112, and then applies to the amplifier 130 a soft limit gain which is equal to either unity or the selected gain value. This variation is represented by the flow chart of FIG. 5b.

Figure 5B:
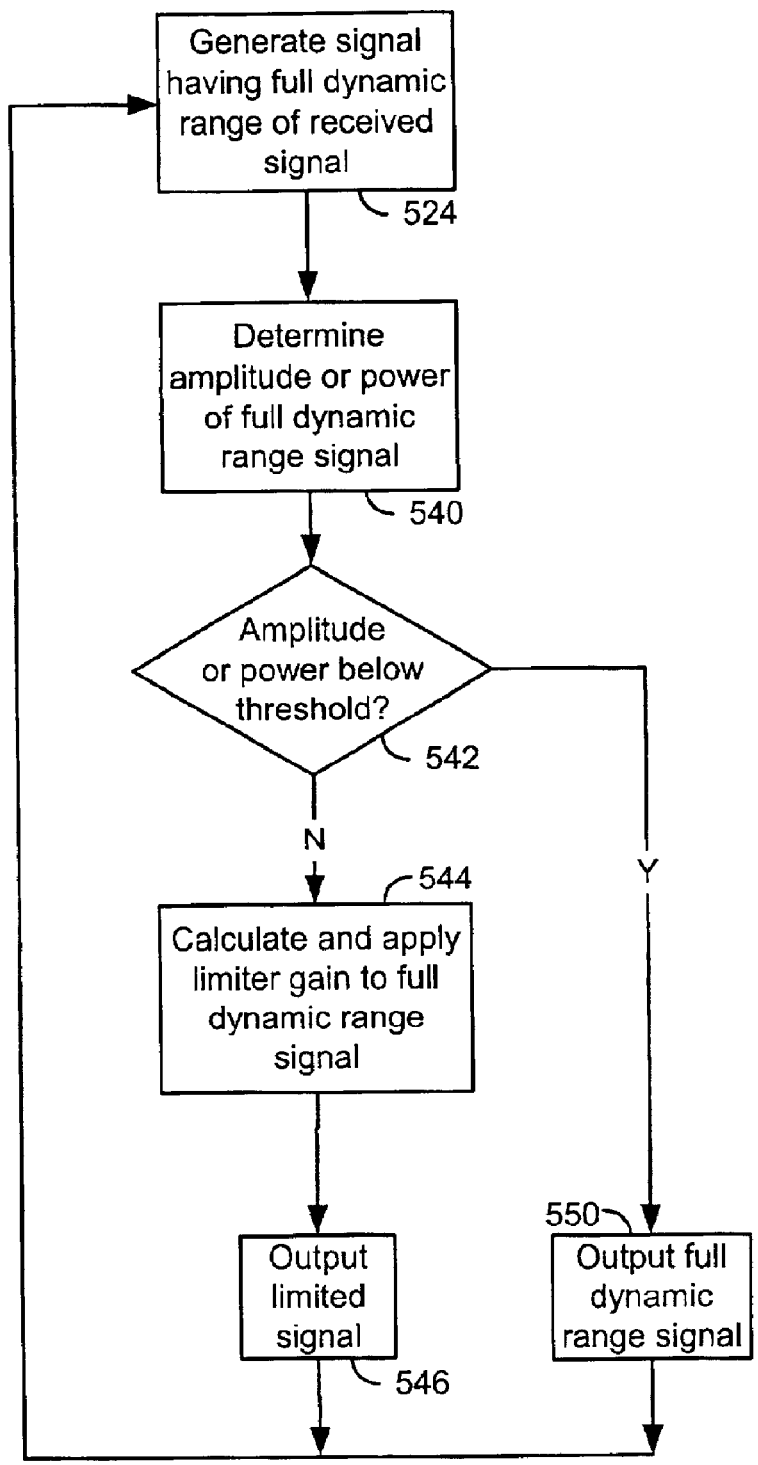

The inverse gain and soft limiting method steps in FIG. 5b will be performed in parallel with the AGC method steps 502 through 520 shown in FIG. 5a and described above. In order to avoid congestion in the drawings however, only the inverse gain and soft limiting method steps 524 through 550 are shown in FIG. 5b. As shown, the amplitude or power of the full dynamic range signal is determined at step 540, and compared to a threshold at step 542. If the amplitude or power of the full dynamic range signal (as determined by the power estimator 140 in the soft limiter 135) is below the threshold, the threshold detector 138 calculates a soft limit gain value equal to unity gain, thereby causing the amplifier 130 to output the full dynamic range signal, at step 550. Alternately, if the amplitude or power of the full dynamic range signal (as determined by the power estimator 140) is not below the threshold, the threshold detector 138 calculates a soft limit gain value which is inversely proportional to the received amplitude or power value, at step 544, thereby causing the amplifier 130 to output the soft limited output signal, at step 546.

The primary signal processor 102 and the secondary signal processor 104 may be implemented in dedicated electronic hardware, or by a DSP as shown in FIG. 4. Alternately, the signal processors 102, 104 may be implemented in software. In computer software implementations of the signal processors, calculation of the full dynamic range signal at the output of the amplifier 112 is one of the most processing-intensive operations. Although conceptually simple, practical implementation of software to provide for this signal generation is difficult. Since the generated full dynamic range signal is soft limited before further processing by signal processing components connected to the final signal output 128, the signal receiver can be simplified by generating the soft limited signal without first generating the full dynamic range signal. A simplified embodiment of the signal receiver is shown in FIG. 6.

Figure 6:
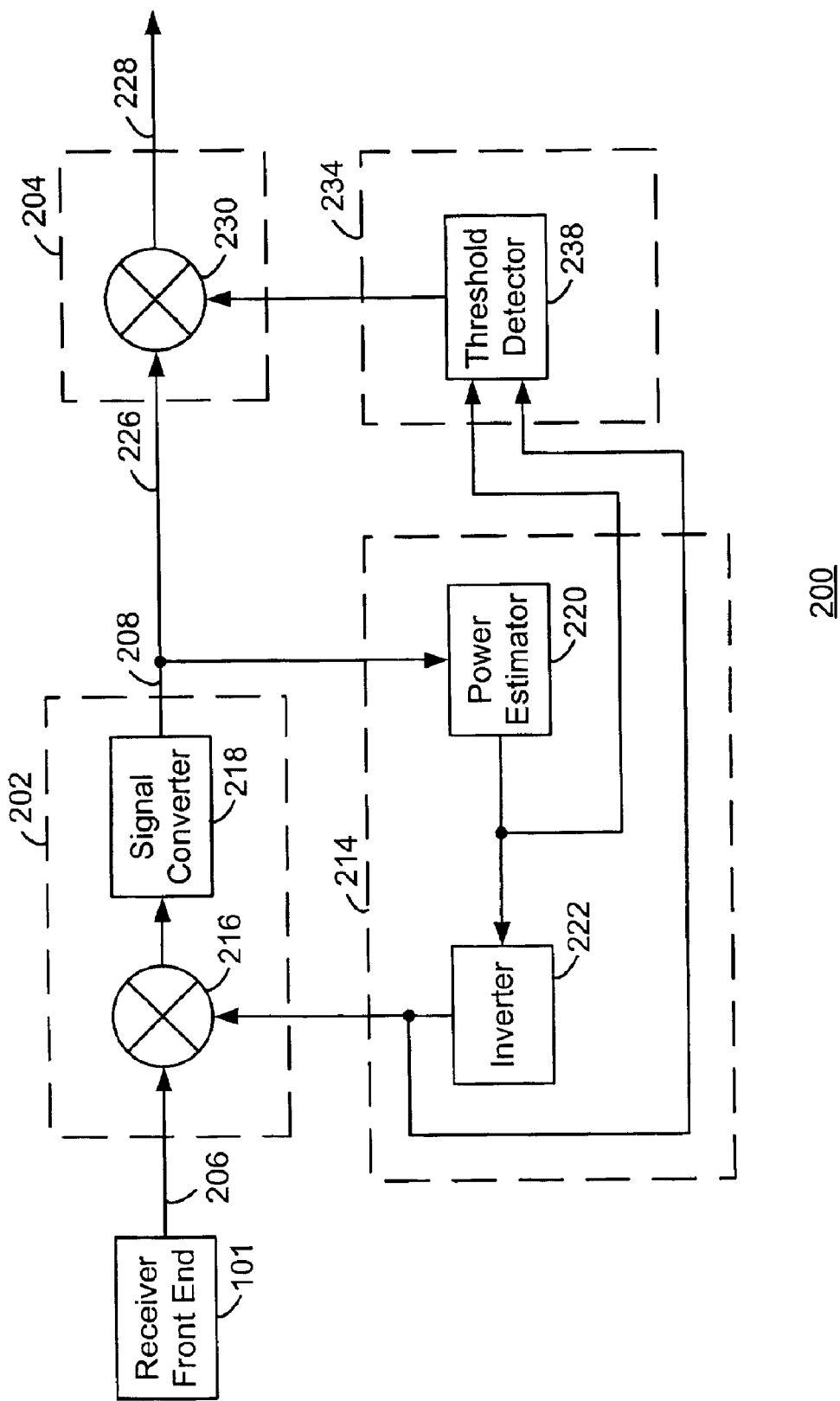
FIG. 6 is a schematic view of a signal receiver according to a further aspect of the invention.

The signal receiver 200, depicted in FIG. 6, generates the soft limited output signal directly, thereby avoiding generation of the full dynamic range signal, and the use of duplicate functional components. The signal receiver 200 comprises a receiver front end 201, a primary signal processor 202, a secondary signal processor 204 coupled to the primary signal processor 202, a primary gain controller 214 coupled to the primary signal processor 202 and a secondary gain controller 234 coupled to the secondary signal processor 204.

The receiver front end 201 may include such components as an antenna, filters and the like normally found in communication signal receivers, and may be substantially similar to the receiver front end 101 shown in FIG. 1. The primary signal processor 202 includes a signal input 206 for receiving an input signal thereon, an intermediate signal output 208 for providing an output signal representative of the input signal, a variable-gain analog signal amplifier 216 coupled to the signal input 206, and a signal converter stage 218 connected between the output of the analog amplifier 216 and the intermediate signal output 208. The analog amplifier 216 has an analog signal input for receiving the input signal thereon, an analog signal output for providing an analog output signal representative of the input signal, and a gain control input for receiving a gain control signal.

As will be appreciated, the gain control signal establishes the gain of the analog amplifier 216. As described above, the gain control signal may be either a gain value to be applied to a signal on the input 206 or a gain control value which is converted into such a gain value. Consequently, the amplitude and power of the intermediate signal varies with the amplitude and power of the input signal, and the gain as established by the gain control signal.

The signal converter 218 receives the intermediate analog signal from the amplifier 216, and produces a digital representation of the intermediate analog signal at its output. The signal converter 218, like the filter stage 118 in receiver 100, may include such components as a quadrature mixer for splitting the intermediate analog signal received from the amplifier 216 into its I and Q components, separate low-pass analog filters each connected to a respective output of the quadrature mixer, and separate ADCs connected to a respective low-pass filter output.

The secondary signal processor 204 includes a digital signal input 226 connected to the intermediate signal output 208 for receiving the intermediate digital output signal from the primary signal processor 202 thereon, a final signal output 228 for providing an output signal representative of the received digital output signal, and a secondary variable-gain digital amplifier 230 coupled to the digital signal input 226 and the final signal output 228. The secondary amplifier 230 includes a digital signal input connected to the signal input 226 for receiving the digital signal thereon, a digital signal output for providing a digital output signal representative of the received digital output signal, and a gain control input for receiving a gain control signal. As will be appreciated, the gain control signal establishes the gain of the secondary amplifier 230.

The primary gain controller 214 controls the gain of the primary amplifier 216, and comprises a power estimator 220 and an inverter 222. The power estimator 220 is connected to the I and Q digital outputs of the signal converter 218, and calculates the average power of the digital signal output by the converter 218. Alternately, the power estimator 220 may calculate the amplitude of the same digital signal.

The inverter 222 includes a power/amplitude input for receiving a power/amplitude estimate thereon, and a gain value output for providing output gain values. The first inverter 222 is connected at its power/amplitude input to the digital output of the power/amplitude estimator 220, and is connected at its gain value output to the gain control input of the primary amplifier 210. The first inverter 222 is configured to calculate a gain for the primary amplifier 216, which is inversely proportional to the power/amplitude value received from the power estimator 220. In this manner, the gain controller 214 maintains the scaled analog output signal of the amplifier 216 substantially constant and within the dynamic range of the ADCs in the signal converter 218 and possibly other receiver components with limited dynamic range. Since the analog amplifier 216 is an analog device, the inverter 222 may include a DAC (not shown) which provides the analog amplifier 216 with an analog gain control signal at its gain control input. Like the gain controller 114, the gain controller 214 represents one simple example of a gain controller, in which a power estimate is inverted by the inverter 122. Other types of gain control and gain control algorithms could instead be implemented, without departing from the scope of the present invention.

The secondary gain controller 234 controls the gain of the secondary amplifier 230, and comprises a threshold detector 238. The threshold detector 238 includes a gain value input which is connected to the gain value output of the inverter 222, a power/amplitude input which is connected to the output of the power estimator 220, and a gain control output which is connected to the gain control input of the secondary amplifier 230. The threshold detector 238 is configured to output a first gain value when a signal characteristic associated with the digital signal output by the first signal processor 202 exceeds a threshold value, and to output a second gain value different from the first gain value when the signal characteristic is less than the threshold value. For example, the threshold detector 238 may be configured to calculate the amplitude of a full dynamic range signal received on the input 206 using a current power/amplitude estimate from the estimator 220 and a corresponding previous gain control signal generated by the inverter 222. A first gain value could then be output by the threshold detector 238 when this calculated amplitude is above a threshold, and a different second gain value could be output when the calculated amplitude is below the threshold. However, it should be understood that the threshold detector 238 is not limited to producing gain values in accordance with the power or amplitude estimates received from the power/amplitude estimator 220. Rather, in one variation (not shown), the threshold detector 238 is configured to output gain values in accordance with gain values received from the first gain inverter 222. The second secondary amplifier 230 and the threshold detector 238 are preferably configured to operate as a soft limiter. Such soft limiting allows soft decision signal processing of the final signal output.

The signal receiver 200 differs from the signal receiver 100 in that the input to the secondary signal processor 204 is not a full dynamic range signal. Further, the signal receiver 200 differs from the signal receiver 100 in the soft limit gain values which are used. If the threshold detector 238 determines that a limiter gain required to generate a full dynamic range signal (as determined from the power or amplitude values received from power estimator 220) is above the threshold, corresponding to a relatively low amplitude full dynamic range signal, then the threshold detector 238 applies to the secondary signal processor 204 a soft limit gain corresponding to the inverse of the gain applied to the primary signal processor 202 to thereby generate the full dynamic range signal. On the other hand, if the limiter gain is below the threshold, corresponding to a relatively large full dynamic range signal, then the soft limit gain is set to a different value (which is preferably unity, but is not necessarily so), to thereby generate a soft limited signal.

However, the overall effect of the receiver 200 is similar to that of the receiver 100. The first signal processor 202 implements a form of AGC, whereas the second signal processor 204 operates effectively as an inverse AGC and soft limiting stage, such that the output of the amplifier 230 is a digital representation of a soft limited version of the full dynamic range signal at the input 206 of the first signal processor 202. The threshold detector 238 and amplifier 230 cooperate to perform both inverse AGC and soft limiting functions.

Figure 7:
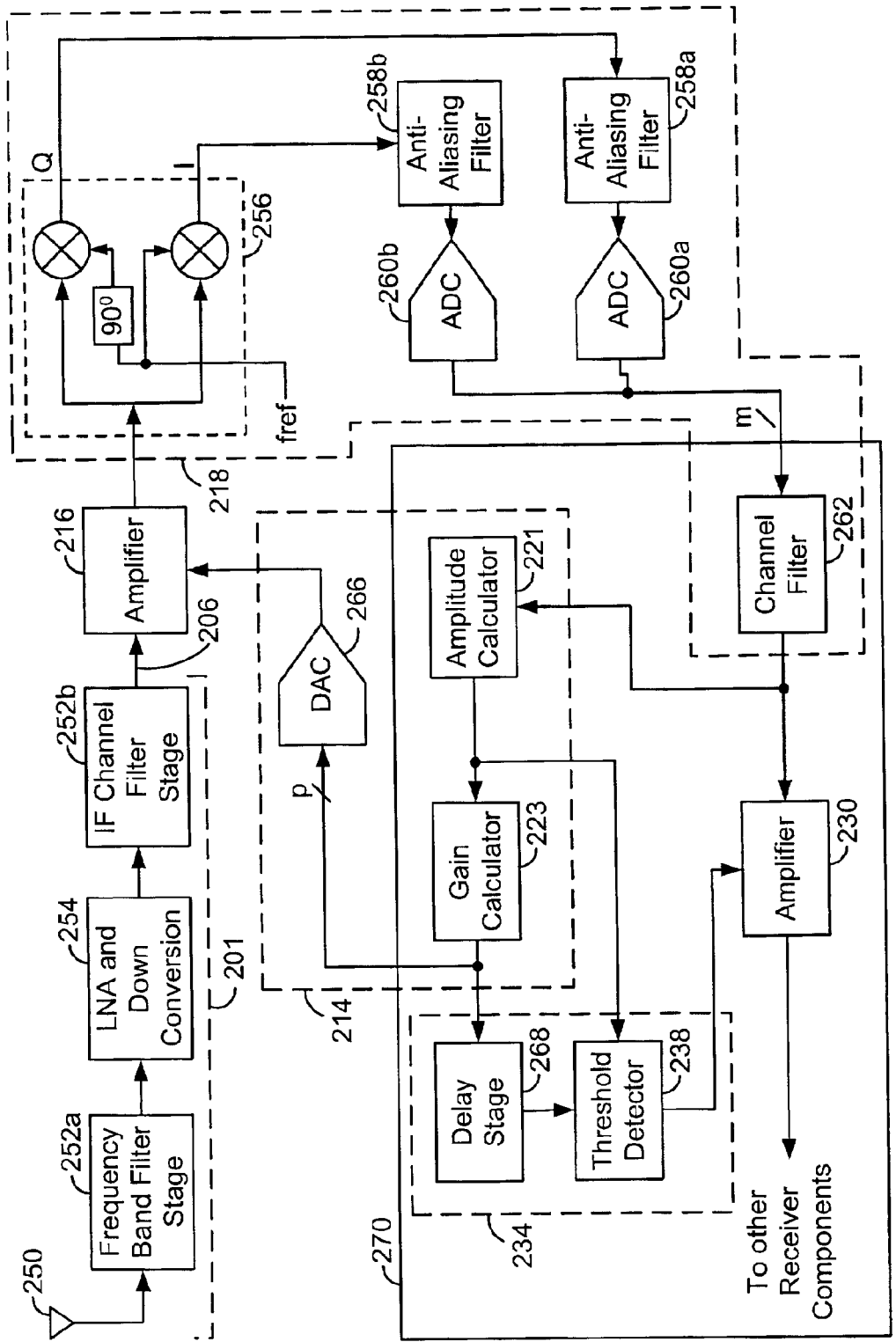
FIG. 7 is a block diagram showing an example implementation of the signal receiver shown in FIG. 6.

An implementation of the signal receiver 200 is depicted in FIG. 7. Front-end receiver components are the same as those shown in FIG. 4, and therefore are described only briefly below. As above, a signal received by an antenna 250 may be processed by a frequency band filter state 252a, LNA and down conversion stage 254, and a channel filter stage 252b, to provide an input signal on the input 206 to the amplifier 216. The filter stage 218 of the primary signal processor 202 comprises a quadrature mixer 256, low-pass anti-aliasing filters 258a, 258b, ADCs 260a, 260b and a channel filter 262.

The primary gain controller 214 is implemented in the receiver 200 as an amplitude calculator 221, a gain calculator 223 connected to the output of the amplitude calculator 221, and a DAC 266 connected to the gain control output of the gain calculator 223 for controlling the gain of the variable-gain analog signal amplifier 216. The secondary gain controller 234 includes a delay stage 268 connected to the gain output of the gain calculator 223, and the threshold detector 238 connected to the outputs of the amplitude calculator 221 and the delay stage 268 for controlling the gain of the variable-gain digital signal amplifier 230.

The amplitude calculator 221, the gain calculator 223 and DAC 266 function as described above to control the gain applied to the signal received by the variable-gain analog signal amplifier 216. The output of the gain calculator 223 may be an actual gain value to be applied by the amplifier 216, but may instead be a gain control value that is then converted into a gain value, by the amplifier 216 for example. Where the gain calculator 223 outputs a control value, then the control value is preferably converted to a gain value in the delay stage 268 or possibly the threshold detector 238. The gain or gain control value is input to the delay stage 268, which is preferably a delay filter, and then to the threshold detector 238.

As described above, the effect of a new gain value at the amplifier 216 is not immediately reflected at the output of channel filter 262. To ensure that the gain value or control signal output by the gain calculator 123 is properly matched in time with the portion of the signal to which the gain was applied by the amplifier 216, the delay stage 268 is designed such that the calculated gain value and the corresponding portion of the signal to which the gain value was applied by the amplifier 216 arrive at the amplifier 230 simultaneously. Although shown as separate blocks, the delay stage 268 may also be implemented as part of the threshold detector 238 or the amplifier 230.

As described in further detail below, the threshold detector 238 and amplifier 230 act as an inverse gain and soft limiting stage. A full dynamic range signal is generated at the output of amplifier 230 for relatively weak signals, whereas a soft limited version of a full dynamic range signal is generated at the output of the amplifier 230 for relatively strong received signals. The soft limited signal output from the amplifier 230 is then provided to further receiver components, preferably including soft decision signal processing components (not shown). These further components may include a signal detector, demodulator, decoder and the like.

At least some of the components which perform AGC, inverse AGC and soft limiting operations may be implemented in a DSP 270. The further receiver components coupled to the output of the amplifier 230 may or may not also be implemented in a DSP.

Figure 8A:
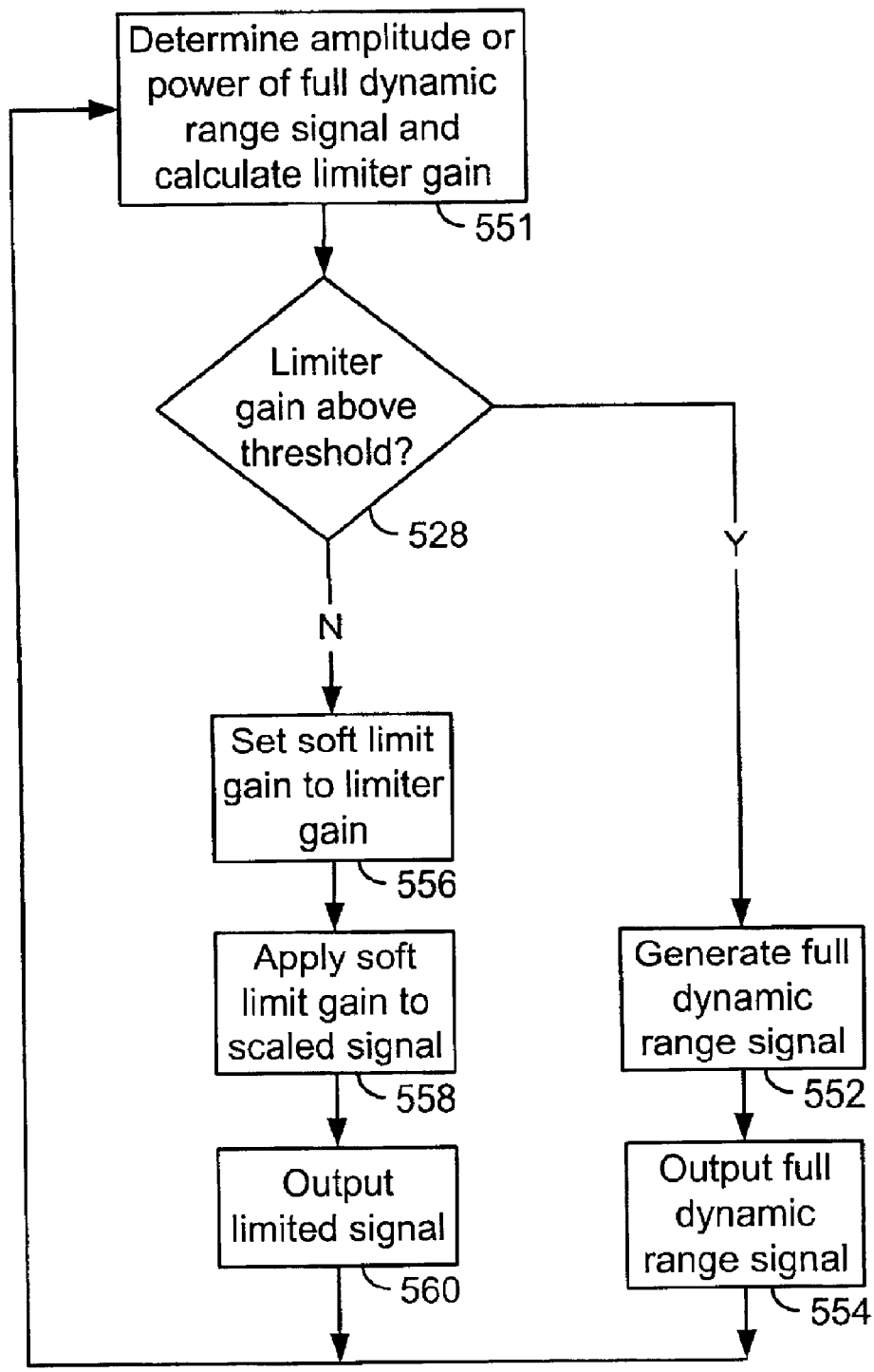
FIGS. 8a, 8b, 8c are flow charts describing alternate embodiments of signal processing methods which may be implemented by the signal receiver shown in FIGS. 6 and 7.

The operation of the signal receiver 200 will now be described with reference to FIG. 8a. The AGC method steps associated with the receiver 200 have not been shown in FIG. 8a, since these steps are the same as steps 502 to 520 of FIG. 5a and have been described above. However, the inverse gain and soft limiting method implemented by the signal receiver 200 differs from the methods described above. It should be appreciated that although ACG method steps are not shown in FIG. 8a, the inverse gain and soft limiting method steps in FIG. 8a are intended to be performed in parallel with AGC method steps.

The gain or gain control value applied to the variable-gain analog signal amplifier 216 and the amplitude estimate from the amplitude estimator 221 are both applied to the threshold detector 238. The gain or control value is delayed by the delay stage 268 to take into account the propagation delay between the amplifier 216 and the amplifier 230.

Upon receipt of the gain or control value and the power/amplitude estimate, at step 551 the threshold detector 238 determines the amplitude or signal power of the full dynamic range received signal, and calculates a limiter gain value which is inversely proportional thereto, as discussed above. The threshold detector 238 compares the calculated limiter gain to a threshold value, at step 528. If the limiter gain is greater than the threshold, indicative of a relatively small signal, then at step 552 the threshold detector 238 applies to the gain control input of the secondary signal amplifier 230 a soft limit gain value which is inversely proportional to the received current gain value. At step 554, the secondary signal amplifier 230 generates the full dynamic range signal using the received scaled signal and the soft limit gain value. However, if the limiter gain is not greater than the threshold (indicative of a relatively large full dynamic range signal), at step 556 the threshold detector 238 sets the soft limit gain value equal to the limiter gain value. At step 558, the threshold detector 238 applies the soft limit gain value to the gain control input of the secondary signal amplifier 230, causing the secondary signal amplifier 230 to generate a soft limited output signal, at step 560. It will be apparent that although the limiter gain calculated in step 550 is inversely proportional to the amplitude or power of the full dynamic range signal as in the first embodiment of the invention, it is preferably different than the limiter gain value of the first embodiment, since it will be applied to the scaled signal instead of the full dynamic range signal.

Figure 8B:
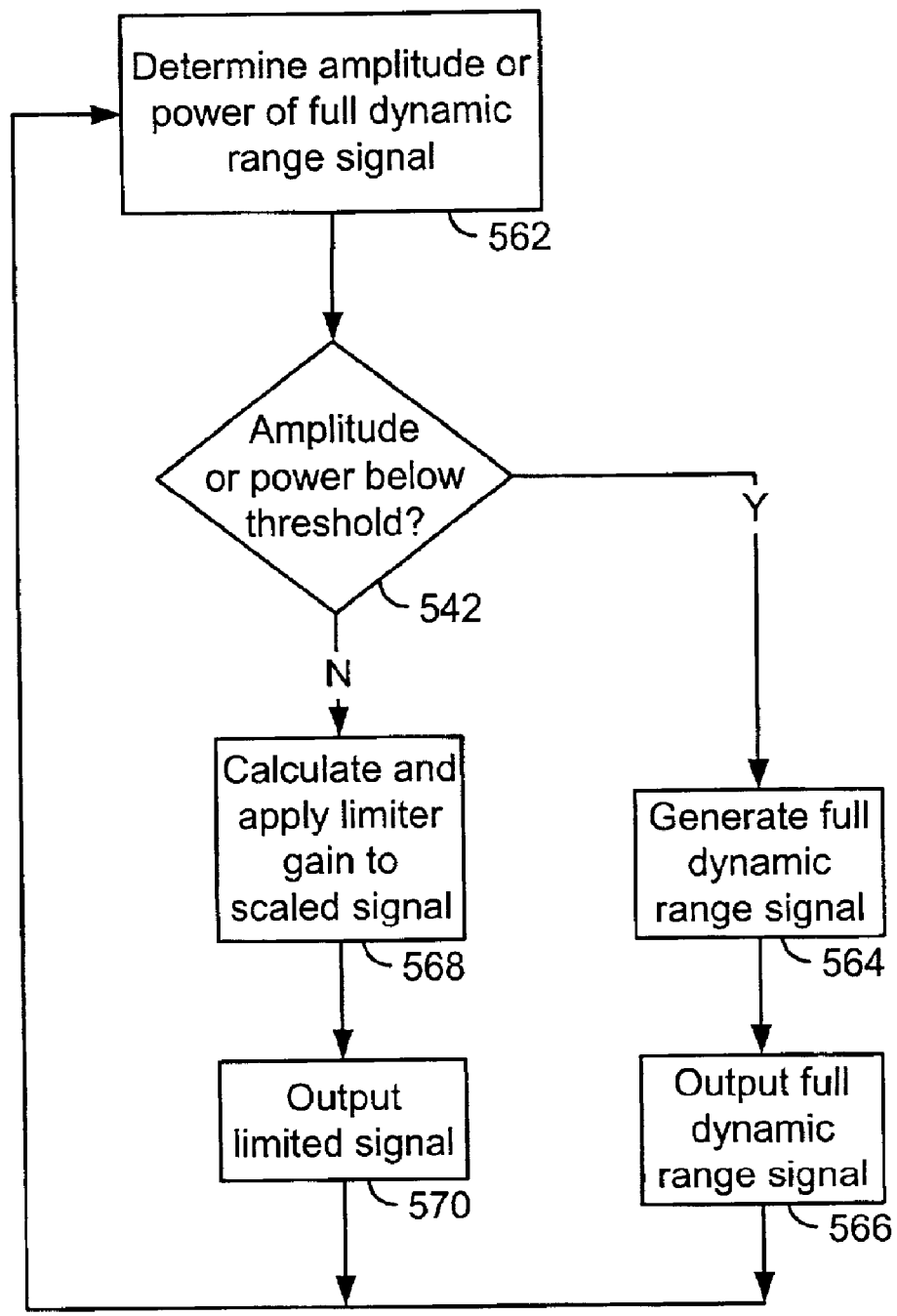

Rather than selecting the gain value to applied to the secondary amplifier 230 based on a calculated gain value, in one variation the threshold detector 238 makes a selection for the gain value based on the amplitude or power of the scaled output signal of the primary signal processor 202. This variation is represented by the flow chart of FIG. 8b. Again, the inverse gain and soft limiting steps shown in FIG. 8b are intended to be performed in parallel with AGC method steps, such as shown in FIG. 5a for example. In FIG. 8b, if the determined amplitude or power is below a threshold, the full dynamic range signal is generated, at step 564, using a soft limit gain value which is inversely proportional to the received gain value, and then output at step 566. If the determined amplitude or power is not below the threshold, the limiter gain is calculated (being inversely proportional to the determined amplitude or power) and then applied to the scaled signal (568) to generate a soft limited output signal (570).

Figure 8C:
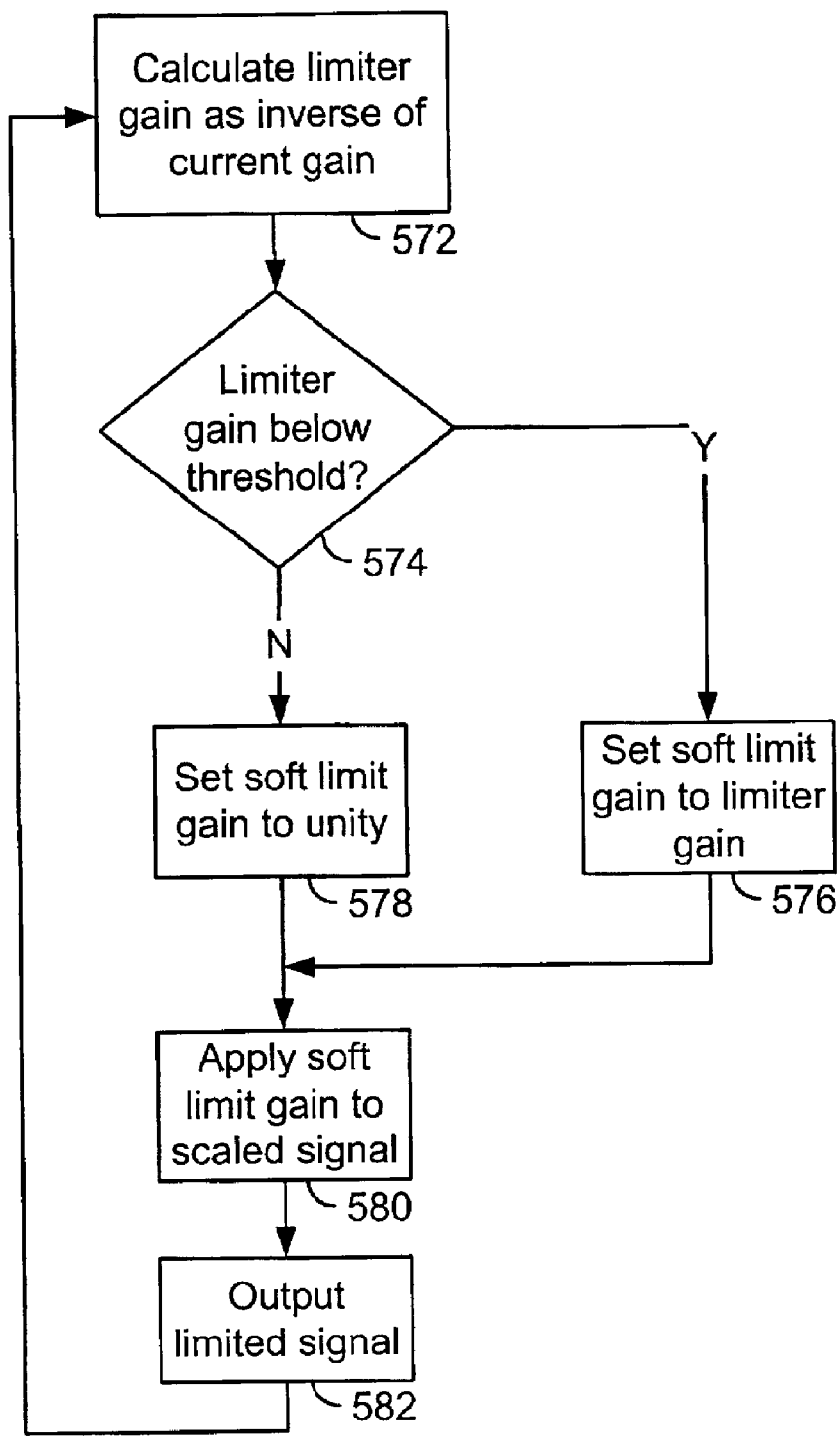

According to a further variation of the present invention, as shown in the flow diagram of FIG. 8c, the limiter gain is calculated as the inverse of the received gain value. Since a gain value determined by an AGC algorithm is typically inversely proportional to the amplitude or power of a received signal, then the inverse of the gain value will be proportional to the full dynamic range signal. In FIG. 8c, this property of the gain value is exploited in inverse AGC processing. As above, the inverse gain and soft limiting method steps are intended to be performed in parallel with a AGC method steps, such as shown in FIG. 5a.

The limiter gain is calculated at step 572 as the inverse of the current gain. If the limiter gain is below a threshold (574), corresponding to a relative large current gain value which would be applied to a weak received signal, then the soft limit gain is set to the limiter gain (576). Otherwise, the soft limit gain is set to unity at step 578. The soft limit gain is then applied to the scaled signal at step 580, to which the scaled signal and power estimate are also input. The limited signal is then output at step 582. Since the limiter gain is the inverse of the current gain value, when the limiter gain is below the threshold and is applied to the scaled signal, the limited signal generated at step 580 corresponds to the full dynamic range signal. In the embodiment shown in FIG. 8c, when the limiter gain is above the threshold, the soft limit gain is set to unity, such that the scaled signal is output as the limited signal. This unity value of the soft limit gain is solely for illustrative purposes. Other soft limit gain values are contemplated to provide for a limited signal which is different from the scaled signal. The unity soft limit gain value however simplifies processing when the full dynamic range signal is not generated.

Although described in the context of a particular receiver architecture, the inverse gain control and limiting technique according to the present invention may be applied to communication devices in which AGC is required or desired but absolute signal amplitude or power is required. The present invention can also provide for soft information processing in systems in which AGC operation requires hard decision processing or otherwise renders implementation of soft decision processing unfeasible. Wireless modems such as those disclosed in U.S. Pat. No. 5,619,531, titled "Wireless Radio Modem with Minimal Interdevice RF Interference", issued on Apr. 8, 1997, and U.S. Pat. No. 5,764,693, titled "Wireless Radio Modem with Minimal Inter-Device RF Interference", issued on Jun. 9, 1998, both assigned to the assignee of the instant invention, represent types of communication devices in which the invention may be implemented. The disclosures of these patents are incorporated herein by reference. Many conventional wired modems also use AGC arrangements and therefore would be suitable for application of the invention.

The instant invention provides for soft decision processing in AGC receivers but requires few additional receiver components and relatively little additional power. As such, the present invention may be used with small mobile communication devices having limited space, power and storage. Other systems and devices in which the invention may be implemented include, but are not limited to, further fixed or mobile communication systems, hand-held communication devices, personal digital assistants (PDAs) with communication functions, cellular phones and two-way pagers.

It will be appreciated that the above description relates to preferred embodiments by way of example only. Many variations on the invention will be apparent to those of ordinary skill, which variations are within the scope of the invention as claimed, whether or not expressly described.

We claim:

1. A signal receiver comprising:
   a primary signal processor comprising a signal input configured to receive an input signal having a first signal dynamic range, an intermediate signal output configured to provide a scaled signal representative of the input signal, a primary variable-gain amplifier coupled to the signal input and the intermediate signal output, and a primary gain controller coupled to the primary amplifier and configured to control a gain applied by the primary amplifier to maintain the scaled signal within a second signal dynamic range;
   wherein the primary gain controller comprises:
      an amplitude calculator comprising an input coupled to the intermediate signal output and an output configured to provide an indication of the signal amplitude of the scaled signal; and
      a gain calculator comprising an input coupled to the amplitude calculator output and an output coupled to the primary amplifier, and configured to calculate a primary gain control value using the indication of the amplitude of the scaled signal to control the gain applied by the primary amplifier; and
   a secondary signal processor comprising a signal input coupled to the intermediate signal output, a final signal output configured to provide an output signal representative of the input signal, a secondary variable-gain amplifier coupled to the intermediate signal output and the final output, and a secondary gain controller coupled to the secondary amplifier and configured to control a gain of the secondary amplifier to set the gain of the secondary amplifier to a first gain value when a parameter associated with the scaled signal exceeds a threshold value, and to set the gain of the secondary amplifier to a second gain value different from the first gain value when the signal parameter is less than the threshold values;
   wherein the secondary gain controller comprises:
      a delay stage comprising an input coupled to the gain calculator to receive the primary gain control value and an output, and configured to apply a predetermined time delay to the primary gain control value to provide a delayed primary gain control value at the output; and
      a threshold detector comprising a first input coupled to the delay stage output, a second input coupled to the amplitude calculator to receive the indication of the amplitude of the scaled signal, and an output coupled to the secondary amplifier, and configured to calculate the parameter and determine whether the parameter is above or below the threshold and to set the gain of the secondary amplifier to the first gain value or the second gain value.

2. The signal receiver of claim 1, wherein the primary gain controller comprises:
   a power estimator comprising an input coupled to the intermediate signal output and an output configured to provide an indication of one of the signal power or signal amplitude of the scaled signal; and
   an inverter comprising an input coupled to the power estimator output and an output coupled to the primary amplifier, and configured to provide a primary gain control value inversely proportional to the signal power or signal amplitude of the scaled signal to control the gain applied by the primary amplifier.

3. The signal receiver of claim 1, wherein the gain calculator calculates the primary gain control value using the indication of the amplitude of the scaled signal and an automatic gain control (AGC) algorithm.

4. The signal receiver of claim 1, wherein the primary gain control value is a value of the gain applied by the primary amplifier.

5. The signal receiver of claim 1, wherein:
   the primary amplifier is an analog amplifier;
   the primary signal processor further comprises an analog to digital converter (ADC) coupled to an output of the primary amplifier and the intermediate signal output, and configured to provide the scaled signal as a digital signal; and the primary gain controller further comprises a digital to analog converter (DAC) coupled to the gain calculator and the primary amplifier, and configured to convert the primary gain control value from a digital signal to an analog signal.

6. The signal receiver of claim 1, wherein:

the primary signal processor further comprises a signal converter coupled to an output of the primary amplifier and the intermediate signal output; and the predetermined time delay is substantially equal to a signal propagation delay associated with the signal converter.

7. The signal receiver of claim 6, wherein the signal converter comprises:

a quadrature mixer comprising an input coupled to the output of the primary amplifier and first and second outputs, and configured to provide in-phase (I) and quadrature (Q) components of the scaled signal on its first and second outputs;

first and second filters respectively coupled to the first and second outputs of the quadrature mixer;

first and second analog to digital converters (ADCs) respectively coupled to the first and second filters; and a digital filter coupled to the first and second ADCs.

8. The signal receiver of claim 7, wherein the amplitude calculator, the gain calculator, the delay stage and the threshold detector are implemented in a digital signal processor (DSP).

9. The signal receiver of claim 8, wherein the secondary amplifier is implemented in the DSP.

10. The signal receiver of claim 1, wherein the parameter is a limiter gain, the limiter gain being inversely proportional to the gain applied by the primary amplifier to generate the scaled signal and the amplitude of the scaled signal.

11. The signal receiver of claim 10, wherein the first gain value is an inverse of the gain applied by the primary amplifier to generate the scaled signal and the second gain value is the limiter gain.

12. The signal receiver of claim 1, wherein the parameter is proportional to the product of the gain applied by the primary amplifier to generate the scaled signal and the amplitude of the scaled signal.

13. The signal receiver of claim 12, wherein the first gain value is a limiter gain, the limiter gain being inversely proportional to the parameter, and the second gain value is an inverse of the gain applied by the primary amplifier to generate the scaled signal.

14. The signal receiver of claim 1, wherein the parameter is a limiter gain, the limiter gain being an inverse of the gain applied by the primary amplifier to generate the scaled signal.

15. The signal receiver of claim 14, wherein the first gain value is unity, and the second gain value is the limiter gain.

16. The signal receiver of claim 1, further comprising an antenna configured to receive communication signals, a first filter stage coupled to the antenna, a frequency converter coupled to the filter stage, and a second filter stage coupled to the frequency converter, an output of the frequency converter coupled to the signal input of the primary signal processor.

17. The signal receiver of claim 1, further comprising receiver components coupled to the final signal output and configured to perform further processing operations on the output signal from the secondary processing stage.

18. A signal receiver comprising:

a primary signal processor comprising a signal input configured to receive an input signal having a first signal dynamic range, an intermediate signal output configured to provide a scaled signal representative of the input signal, a primary variable-gain amplifier coupled to the signal input and the intermediate signal output, and a primary gain controller coupled to the primary amplifier and configured to control a gain applied by the primary amplifier to maintain the scaled signal within a second signal dynamic range;

a secondary signal processor comprising a signal input coupled to the intermediate signal output, a final signal output configured to provide an output signal representative of the input signal, a first secondary variable-gain amplifier having an input coupled to the intermediate output and an output configured to provide a full dynamic range output signal having the first signal dynamic range, a second secondary variable-gain amplifier coupled to the output of the first secondary amplifier and the final output, and a secondary gain controller coupled to the secondary amplifier and comprising a first gain control output configured to control a gain of the first secondary amplifier to set a gain of the first secondary amplifier to an inverse of the gain of the primary amplifier, and a second gain control output configured to control a gain of the second secondary amplifier to set the gain of the second secondary amplifier to a first gain value when a signal parameter of the scaled signal exceeds a threshold value, and to set the gain of the secondary amplifier to a second gain value different from the first gain value when the signal parameter is less than the threshold value; and wherein;

the primary gain controller comprises:

a primary power estimator comprising an input coupled to the intermediate signal output and an output configured to provide an indication of one of the signal power or signal amplitude of the scaled signal; and a primary inverter comprising an input coupled to the primary power estimator output and an output coupled to the primary amplifier, and configured to provide a primary gain control value inversely proportional to the signal power or signal amplitude of the scaled signal to control the gain applied by the primary amplifier; and the secondary gain controller comprises;

a first secondary inverter comprising an input coupled to the primary inverter and an output coupled to the first secondary amplifier, and configured to provide the inverse of the gain of the primary amplifier as the gain of the first secondary amplifier;

a gain estimator comprising an input coupled to the output of the first secondary amplifier and an output configured to provide a gain estimate; and a threshold detector coupled to the gain estimator and configured to calculate the parameter and determine whether the parameter is above or below the threshold and to set the gain of the second secondary amplifier to the first gain value or the second gain value.

19. The signal receiver of claim 18, wherein:

the gain estimator comprises a secondary power estimator comprising an input coupled to the output of the first secondary amplifier and an output configured to provide an indication of one of the signal power or signal amplitude of the full dynamic range signal;

the parameter is proportional to the signal power or signal amplitude of the full dynamic range signal;

the first gain value is a limiter gain, the limiter gain being inversely proportional to the signal power or signal amplitude of the full dynamic range signal; and the second gain value is unity.

20. The signal receiver of claim 18, wherein:

the gain estimator comprises:

a secondary power estimator comprising an input coupled to the output of the first secondary amplifier and an output configured to provide an indication of one of the signal power or signal amplitude of the full dynamic range signal; and a second secondary inverter comprising an input coupled to the power estimator output and an output coupled to the second secondary amplifier, and configured to provide a limiter gain inversely proportional to the signal power or signal amplitude of the full dynamic range signal as the gain estimate;

the parameter is the limiter gain;

the first gain value is unity; and the second gain value is the limiter gain.

21. The signal receiver of claim 18, wherein:

the primary amplifier and the primary gain controller in the primary signal processor comprise an automatic gain control (AGC) system;

the first secondary amplifier and the first secondary inverter in the secondary signal processor comprise an inverse AGC system; and the second secondary amplifier and the threshold detector in the secondary signal processor comprise a soft limiter.

22. The signal receiver of claim 18, wherein:

the primary signal processor further comprises a signal converter coupled to an output of the primary amplifier and the intermediate signal output; and the secondary gain controller further comprises a delay stage coupled to the first secondary inverter and configured to apply a predetermined time delay to a signal at either the input or the output of the first primary inverter, the predetermined time delay being substantially equal to a signal propagation delay associated with the signal converter.

23. The signal receiver of claim 22, wherein the signal converter comprises:

a quadrature mixer comprising an input coupled to the output of the primary amplifier and first and second outputs, and configured to provide in-phase (I) and quadrature (Q) components of the scaled signal on its first and second outputs;

first and second filters respectively coupled to the first and second outputs of the quadrature mixer;

first and second analog to digital converters (ADCs) respectively coupled to the first and second filters; and a digital filter coupled to the first and second ADCs.

24. The signal receiver of claim 18, wherein the secondary signal processor is implemented in a digital signal processor (DSP).

25. The signal receiver of claim 18, further comprising an antenna configured to receive communication signals, a first filter stage coupled to the antenna, a frequency converter coupled to the filter stage, and a second filter stage coupled to the frequency converter, an output of the frequency converter coupled to the signal input of the primary signal processor.

26. The signal receiver of claim 18, further comprising receiver components coupled to the final signal output and configured to perform further processing operations on the output signal from the secondary processing stage.

27. In a signal receiver, a method for processing a signal, the method comprising the steps of:

receiving an input signal having a first signal dynamic range;

applying a first controlled gain to the input signal to provide a scaled signal representative of the input signal;

controlling the first controlled gain to maintain the scaled signal within a second signal dynamic range by estimating one of the signal power or signal amplitude of the scaled signal; and providing a first gain control value inversely proportional to the signal power or signal amplitude of the scaled signal to control the first controlled gain;

applying a second controlled gain to the scaled signal to provide an output signal representative of the input signal; and controlling the second controlled gain to set the second controlled gain to a first gain value when a parameter associated with the scaled signal exceeds a threshold value, and to set the second controlled gain to a second gain value different from the first gain value when the signal parameter is less than the threshold value, by delaying the first controlled gain by a predetermined time to provide a delayed first controlled gain; calculating the parameter using the delayed first controlled gain and the signal power or signal amplitude of the scaled signal; and determining whether the parameter is above or below the threshold.

28. The method of claim 27, wherein the step of providing a first gain control value comprises calculating the first gain control value using the signal power or signal amplitude of the scaled signal and an automatic gain control (AGC) algorithm.

29. The method of claim 27 further comprising the steps of:

separating the scaled signal into its in-phase (I) and quadrature (Q) signal components;

filtering the I and Q signal components;

converting the I and Q signal components from analog signals to digital signals; and filtering the digital signals, wherein the predetermined time is substantially equal to a signal propagation delay associated with the steps of separating, filtering the I and Q signal components, converting and filtering the digital signals.

30. The method of claim 27, wherein the steps of controlling the first controlled gain, applying the second controlled gain, and controlling the second controlled gain are substantially performed in a digital signal processor (DSP).

31. The method of claim 27, wherein:

the parameter is a limiter gain, the limiter gain being inversely proportional to the delayed first controlled gain and the signal power or signal amplitude of the scaled signal;

the first gain value is an inverse of the delayed first controlled gain; and the second gain value is the limiter gain.

32. The method of claim 27, wherein:

the parameter is proportional to the product of the delayed first controlled gain and the signal power or signal amplitude of the scaled signal;

the first gain value is a limiter gain, the limiter gain being inversely proportional to the parameter; and the second gain value is an inverse of the delayed first controlled gain.

33. The method of claim 27, wherein:
the parameter is a limiter gain, the limiter gain being an inverse of the first controlled gain;
the first gain value is unity; and
the second gain value is the limiter gain.

34. The method of claim 27, wherein the signal receiver is implemented in a communication device selected from the group consisting of a mobile communication device, a personal digital assistant (PDA), a cellular telephone, a two-way pager, and a wireless modem.

35. The method of claim 27, wherein the step of applying a second controlled gain to the scaled signal comprises the steps of:
applying an inverse of the first controlled gain to the scaled signal to provide a full dynamic range output signal having the first signal dynamic range; and
applying the second controlled gain to the full dynamic range signal.

36. The method of claim 35, wherein the step of controlling the second controlled gain comprises:
estimating one of the signal power and the signal amplitude of the full dynamic range signal; and
calculating the parameter using the signal power or signal amplitude of the full dynamic range signal.

37. The method of claim 36, wherein:
the parameter is proportional to the signal power or signal amplitude of the full dynamic range signal;
the first gain value is a limiter gain, the limiter gain being inversely proportional to the signal power or signal amplitude of the full dynamic range signal; and
the second gain value is unity.

38. The method of claim 36, wherein:
the parameter is the limiter gain;
the first gain value is unity; and
the second gain value is the limiter gain.

39. The method of claim 35, wherein:
the steps of applying a first controlled gain and controlling the first controlled gain comprise an automatic gain control (AGC) method;
the step of applying an inverse of the first controlled gain to the scaled signal comprises an inverse AGC method; and
the steps of applying a second controlled gain and controlling the second controlled gain comprise a soft limiting method.

40. A signal receiver comprising:
means for processing an input signal having a first signal dynamic range to provide a scaled signal representative of the input signal, the first means for processing comprising means for receiving an input signal, means for amplifying the input signal and means for controlling a gain applied by the means for amplifying to maintain the scaled signal within a second signal dynamic range by estimating one of the signal power or signal amplitude of the scaled signal; and providing a first gain control value inversely proportional to the signal vower or signal amplitude of the scaled signal to control the first controlled gain; and
means for processing the scaled signal to provide an output signal representative of the input signal, the means for processing the scaled signal comprising means for amplifying the scaled signal and means for controlling a gain of the means for amplifying the scaled signal to set the gain of the means for amplifying the scaled signal to a first gain value when a parameter associated with the scaled signal exceeds a threshold value, and to set the gain of the means for amplifying the scaled signal to a second gain value different from the first gain value when the signal parameter is less than the threshold value by delaying the first controlled gain by a predetermined time to provide a delayed first controlled gain; calculating the parameter using the delayed first controlled gain and the signal vower or signal amplitude of the scaled signal; and determining whether the parameter is above or below the threshold.

41. A wireless communication device comprising:
a transceiver configured to transmit and receive communication signals; and
a digital signal processor (DSP) operatively coupled to the transceiver, the DSP comprising computer software code for processing a received communication signal having a first dynamic range, by performing the functions of:
applying a first controlled gain to the received communication signal to provide a scaled signal representative of the received signal;
controlling the first controlled gain to maintain the scaled signal within a second signal dynamic range by estimating one of the signal power or signal amplitude of the scaled signal; and providing a first gain control value inversely proportional to the signal power or signal amplitude of the scaled signal to control the first controlled gain;
applying a second controlled gain to the scaled signal to provide an output signal representative of the received signal; and
controlling the second controlled gain to set the second controlled gain to a first gain value when a parameter associated with the scaled signal exceeds a threshold value, and to set the second controlled gain to a second gain value different from the first gain value when the signal parameter is less than the threshold value, by delaying the first controlled gain by a predetermined time to provide a delayed first controlled gain; calculating the parameter using the delayed first controlled gain and the signal power or signal amplitude of the scaled signal; and determining whether the parameter is above or below the threshold.

42. The wireless communication device of claim 41, wherein the device is selected from the group consisting of a mobile communication device, a personal digital assistant (PDA), a cellular telephone, a two-way pager, and a wireless modem.

43. A computer readable medium containing instructions for implementing a method for processing a signal, the method comprising the steps of:
receiving an input signal having a first signal dynamic range;
applying a first controlled gain to the input signal to provide a scaled signal representative of the input signal;
controlling the first controlled gain to maintain the scaled signal within a second signal dynamic range by estimating one of the signal power or signal amplitude of the scaled signal; and providing a first gain control value inversely proportional to the signal power or signal amplitude of the scaled signal to control the first controlled gain;

applying a second controlled gain to the scaled signal to provide an output signal representative of the input signal; and controlling the second controlled gain to set the second controlled gain to a first gain value when a parameter associated with the scaled signal exceeds a threshold value, and to set the second controlled gain to a second gain value different from the first gain value when the signal parameter is less than the threshold value, by delaying the first controlled gain by a predetermined time to provide a delayed first controlled gain; calculating the parameter using the delayed first controlled gain and the signal power or signal amplitude of the scaled signal; and determining whether the parameter is above or below the threshold.

44. A signal receiver comprising:

a primary signal processor comprising a signal input configured to receive an input signal having a first signal dynamic range, an intermediate signal output configured to provide a scaled signal representative of the input signal, a primary variable-gain amplifier coupled to the signal input and the intermediate signal output, and a primary gain controller coupled to the primary amplifier and configured to control a gain applied by the primary amplifier to maintain the scaled signal within a second signal dynamic range; and a secondary signal processor comprising a signal input coupled to the intermediate signal output, a final signal output configured to provide an output signal representative of the input signal, a secondary variable-gain amplifier coupled to the intermediate signal output and the final output, and a secondary gain controller coupled to the secondary amplifier and configured to control a gain of the secondary amplifier to set the gain of the secondary amplifier to a first gain value when a parameter associated with the scaled signal exceeds a threshold value, and to set the gain of the secondary amplifier to a second gain value different from the first gain value when the signal parameter is less than the threshold value; and wherein the secondary gain controller comprises:

a delay stage comprising an input coupled to the gain calculator to receive the primary gain control value and an output, and configured to apply a predetermined tune delay to the primary gain control value to provide a delayed primary gain control value at the output; and a threshold detector comprising a first input coupled to the delay stage output, a second input coupled to the amplitude calculator to receive the indication of the amplitude of the scaled signal, and an output coupled to the secondary amplifier, and configured to calculate the parameter and determine whether the parameter is above or below the threshold and to set the gain of the secondary amplifier to the first gain value or the second gain value.

45. The signal receiver of claim 44, wherein the primary gain controller comprises:

a power estimator comprising an input coupled to the intermediate signal output and an output configured to provide an indication of one of the signal power or signal amplitude of the scaled signal; and an inverter comprising an input coupled to the power estimator output and an output coupled to the primary amplifier, and configured to provide a primary gain control value inversely proportional to the signal power or signal amplitude of the scaled signal to control the gain applied by the primary amplifier.

46. The signal receiver of claim 44, wherein the gain calculator calculates the primary gain control value using the indication of the amplitude of the scaled signal and an automatic gain control (AGC) algorithm.

47. The signal receiver of claim 44, wherein the primary gain control value is a value of the gain applied by the primary amplifier.

48. The signal receiver of claim 44, wherein:

the primary amplifier is an analog amplifier;

the primary signal processor further comprises an analog to digital converter (ADC) coupled to an output of the primary amplifier and the intermediate signal output, and configured to provide the scaled signal as a digital signal; and the primary gain controller further comprises a digital to analog converter (DAC) coupled to the gain calculator and the primary amplifier, and configured to convert the primary gain control value from a digital signal to an analog signal.

49. The signal receiver of claim 44, wherein:

the primary signal processor further comprises a signal converter coupled to an output of the primary amplifier and the intermediate signal output; and the predetermined time delay is substantially equal to a signal propagation delay associated with the signal converter.

50. The signal receiver of claim 49, wherein the signal converter comprises:

a quadrature mixer comprising an input coupled to the output of the primary amplifier and first and second outputs, and configured to provide in-phase (I) and quadrature (Q) components of the scaled signal on its first and second outputs;

first and second filters respectively coupled to the first and second outputs of the quadrature mixer;

first and second analog to digital converters (ADCs) respectively coupled to the first and second filters; and a digital filter coupled to the first and second ADCs.

51. The signal receiver of claim 50, wherein the amplitude calculator, the gain calculator, the delay stage and the threshold detector are implemented in a digital signal processor (DSP).

52. The signal receiver of claim 51, wherein the secondary amplifier is implemented in the DSP.

53. The signal receiver of claim 44, wherein the parameter is a limiter gain, the limiter gain being inversely proportional to the gain applied by the primary amplifier to generate the scaled signal and the amplitude of the scaled signal.

54. The signal receiver of claim 52, wherein the first gain value is an inverse of the gain applied by the primary amplifier to generate the scaled signal and the second gain value is the limiter gain.

55. The signal receiver of claim 44, wherein the parameter is proportional to the product of the gain applied by the primary amplifier to generate the scaled signal and the amplitude of the scaled signal.

56. The signal receiver of claim 55, wherein the first gain value is a limiter gain, the limiter gain being inversely proportional to the parameter, and the second gain value is an inverse of the gain applied by the primary amplifier to generate the scaled signal.

57. The signal receiver of claim 44, wherein the parameter is a limiter gain, the limiter gain being an inverse of the gain applied by the primary amplifier to generate the scaled signal.

58. The signal receiver of claim 57, wherein the first gain value is unity, and the second gain value is the limiter gain.

59. The signal receiver of claim 44, further comprising an antenna configured to receive communication signals, a first filter stage coupled to the antenna, a frequency converter coupled to the filter stage, and a second filter stage coupled to the frequency converter, an output of the frequency converter coupled to the signal input of the primary signal processor.

60. The signal receiver of claim 44, further comprising receiver components coupled to the final signal output and configured to perform further processing operations on the output signal from the secondary processing stage.

61. In a signal receiver, a method for processing a signal, the method comprising the steps of:
receiving an input signal having a first signal dynamic range;
applying a first controlled gain to the input signal to provide a scaled signal representative of the input signal;
controlling the first controlled gain to maintain the scaled signal within a second signal dynamic range;
applying a second controlled gain to the scaled signal to provide an output signal representative of the input signal; and controlling the second controlled gain to set the second controlled gain to a first gain value when a parameter associated with the scaled signal exceeds a threshold value, and to set the second controlled gain to a second gain value different from the first gain value when the signal parameter is less than the threshold value, by delaying the first controlled gain by a predetermined time to provide a delayed first controlled gain; calculating the parameter using the delayed first controlled gain and the signal power or signal amplitude of the scaled signal; and determining whether the parameter is above or below the threshold; and further comprising the steps of:
separating the scaled signal into its in-phase (I) and quadrature (Q) signal components; filtering the I and Q signal components;
converting the I and Q signal components from analog signals to digital signals; and
filtering the digital signals, wherein the predetermined time is substantially equal to a signal propagation delay associated with the steps of separating, filtering the I and Q signal components, converting and filtering the digital signals.

62. The method of claim 61, wherein the step of providing a first gain control value comprises calculating the first gain control value using the signal power or signal amplitude of the scaled signal and an automatic gain control (AGO) algorithm.

63. The method of claim 61, wherein the steps of controlling the first controlled gain, applying the second controlled gain, and controlling the second controlled gain are substantially performed in a digital signal processor (DSP).

64. The method of claim 61, wherein:
the parameter is a limiter gain, the limiter gain being inversely proportional to the delayed first controlled gain and the signal power or signal amplitude of the scaled signal;
the first gain value is an inverse of the delayed first controlled gain; and
the second gain value is the limiter gain.

65. The method of claim 61, wherein:
the parameter is proportional to the product of the delayed first controlled gain and the signal power or signal amplitude of the scaled signal;
the first gain value is a limiter gain, the limiter gain being inversely proportional to the parameter; and
the second gain value is an inverse of the delayed first controlled gain.

66. The method of claim 61, wherein:
the parameter is a limiter gain, the limiter gain being an inverse of the first controlled gain;
the first gain value is unity; and
the second gain value is the limiter gain.

67. The method of claim 61, wherein the signal receiver is implemented in a communication device selected from the group consisting of a mobile communication device, a personal digital assistant (PDA), a cellular telephone, a two-way pager, and a wireless modem.

68. The method of claim 61, wherein the step of applying a second controlled gain to the scaled signal comprises the steps of:
applying an inverse of the first controlled gain to the scaled signal to provide a full dynamic range output signal having the first signal dynamic range; and
applying the second controlled gain to the full dynamic range signal.

69. The method of claim 68, wherein the step of controlling the second controlled gain comprises:
estimating one of the signal power and the signal amplitude of the full dynamic range signal; and
calculating the parameter using the signal power or signal amplitude of the full dynamic range signal.

70. The method of claim 69, wherein:
the parameter is proportional to the signal power or signal amplitude of the full dynamic range signal;
the first gain value is a limiter gain, the limiter gain being inversely proportional to the signal power or signal amplitude of the full dynamic range signal; and
the second gain value is unity.

71. The method of claim 69, wherein:
the parameter is the limiter gain;
the first gain value is unity; and
the second gain value is the limiter gain.

72. The method of claim 68, wherein:
the steps of applying a first controlled gain and controlling the first controlled gain comprise an automatic gain control (AGC) method;
the step of applying an inverse of the first controlled gain to the scaled signal comprises an inverse AGC method; and
the steps of applying a second controlled gain and controlling the second controlled gain comprise a soft limiting method.

73. A wireless communication device comprising:
a transceiver configured to transmit and receive communication signals; and
a digital signal processor (DSP) operatively coupled to the transceiver, the DSP comprising computer software code for processing a received communication signal having a first dynamic range, by performing the functions of:
applying a first controlled gain to the received communication signal to provide a scaled signal representative of the received signal;
controlling the first controlled gain to maintain the scaled signal within a second signal dynamic range;
applying a second controlled gain to the scaled signal to provide an output signal representative of the received signal; and controlling the second controlled gain to set the second controlled gain to a first gain value when a parameter associated with the scaled signal exceeds a threshold value, and to set the second controlled gain to a second gain value different from the first gain value when the signal parameter is less than the threshold value, by delaying the first controlled gain by a predetermined time to provide a delayed first controlled gain; calculating the parameter using the delayed first controlled gain and the signal power or signal amplitude of the scaled signal; and determining whether the parameter is above or below the threshold.

74. The wireless communication device of claim 73, wherein the device is selected from the group consisting of a mobile communication device, a personal digital assistant (PDA), a cellular telephone, a two-way pager, and a wireless modem.

75. A computer readable medium containing instructions for implementing a method for processing a signal, the method comprising the steps of:

receiving an input signal having a first signal dynamic range;

applying a first controlled gain to the input signal to provide a scaled signal representative of the input signal;

controlling the first controlled gain to maintain the scaled signal within a second signal dynamic range;

applying a second controlled gain to the scaled signal to provide an output signal representative of the input signal; and controlling the second controlled gain to set the second controlled gain to a first gain value when a parameter associated with the scaled signal exceeds a threshold value, and to set the second controlled gain to a second gain value different from the first gain value when the signal parameter is less than the threshold value, by delaying the first controlled gain by a predetermined time to provide a delayed first controlled gain; calculating the parameter using the delayed first controlled gain and the signal power or signal amplitude of the scaled signal; and determining whether the parameter is above or below the threshold.

* * * * *

UNITED STATES PATENT AND TRADEMARK OFFICE
CERTIFICATE OF CORRECTION

PATENT NO.       : 6,904,274 B2
APPLICATION NO. : 09/990126
DATED            : June 7, 2005
INVENTOR(S)      : Simmons et al.

It is certified that error appears in the above-identified patent and that said Letters Patent is hereby corrected as shown below:

Column 20, line 30, replace "wherein;" with -- wherein: --

Column 20, line 45, replace "comprises;" with -- comprises: --

Column 26, line 49, replace "of claim 52" with -- of claim 53 --

Signed and Sealed this

Second Day of January, 2007

JON W. DUDAS
*Director of the United States Patent and Trademark Office*